(12) United States Patent
Risbo

(10) Patent No.: US 8,369,973 B2
(45) Date of Patent: Feb. 5, 2013

(54) EFFICIENT ASYNCHRONOUS SAMPLE RATE CONVERSION

(75) Inventor: Lars Risbo, Hvalsø (DK)

(73) Assignee: Texas Instruments Incorporated, Dallas, TX (US)

( * ) Notice: Subject to any disclaimer, the term of this patent is extended or adjusted under 35 U.S.C. 154(b) by 871 days.

(21) Appl. No.: 12/397,521

(22) Filed: Mar. 4, 2009

(65) Prior Publication Data

US 2009/0319065 A1 Dec. 24, 2009

Related U.S. Application Data

(60) Provisional application No. 61/074,100, filed on Jun. 19, 2008.

(51) Int. Cl.
*G06F 17/00* (2006.01)

(52) U.S. Cl. .......................................... 700/94

(58) Field of Classification Search .................... 700/94; 375/232, 355; 370/545, 538, 543; 708/313; 341/61

See application file for complete search history.

(56) References Cited

U.S. PATENT DOCUMENTS

| | | | |
|---|---|---|---|
| 6,208,671 B1 | 3/2001 | Paulos et al. | |
| 6,226,661 B1 * | 5/2001 | Savell | 708/313 |
| 7,342,525 B2 * | 3/2008 | Kang et al. | 341/143 |
| 2003/0025620 A1 * | 2/2003 | Bland | 341/61 |
| 2008/0068234 A1 * | 3/2008 | Forman et al. | 341/61 |

OTHER PUBLICATIONS

Rajamani, et al., "An Efficient Algorithm for Sample Rate Conversion from CD to DAT", Signal Processing Letters, vol. 7, No. 10 (IEEE, Oct. 2000), pp. 288-290.

Vaidyanathan, "Multirate digital filters, filter banks, polyphase networks, and applications: a tutorial", Proceedings of the IEEE, vol. 78, No. 1 (1990), pp. 56-93.

* cited by examiner

*Primary Examiner* — Andrew C Flanders
(74) *Attorney, Agent, or Firm* — Alan A. R. Cooper; Wade J. Brady, III; Frederick J. Telecky, Jr.

(57) ABSTRACT

Asynchronous sample rate conversion for use in a digital audio receiver is disclosed. Different algorithms are applied for the upsampling and downsampling cases. In the upsampling case, the input signal is upsampled and filtered, before the application of a finite impulse response (FIR) filter. In the downsampling case, the input signal is filtered by an FIR filter, and then filtered and downsampled. The FIR coefficients of the fractional delay FIR filter are calculated by evaluation of polynomial expressions over intervals of the filter impulse response, at times corresponding to the input sample points.

41 Claims, 11 Drawing Sheets

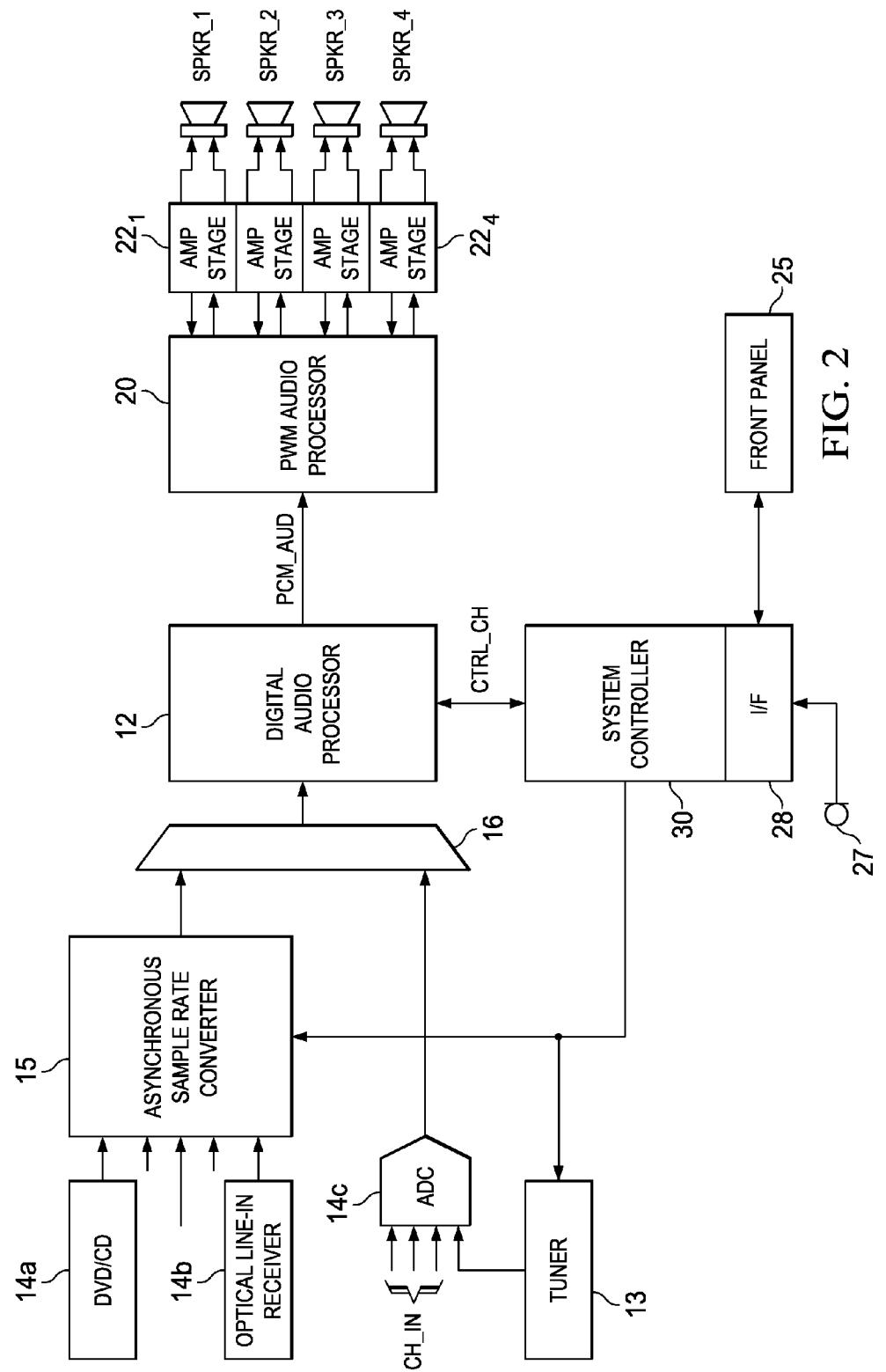

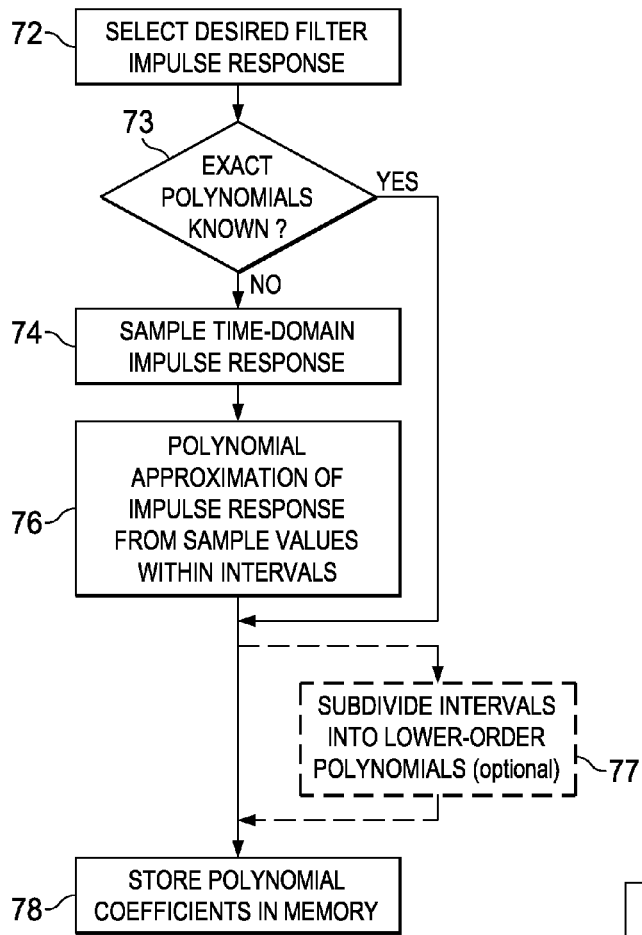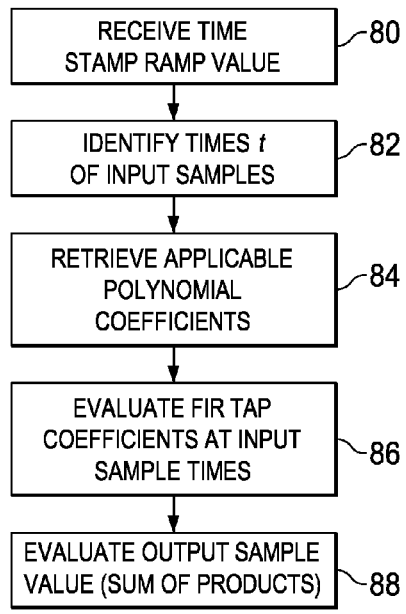

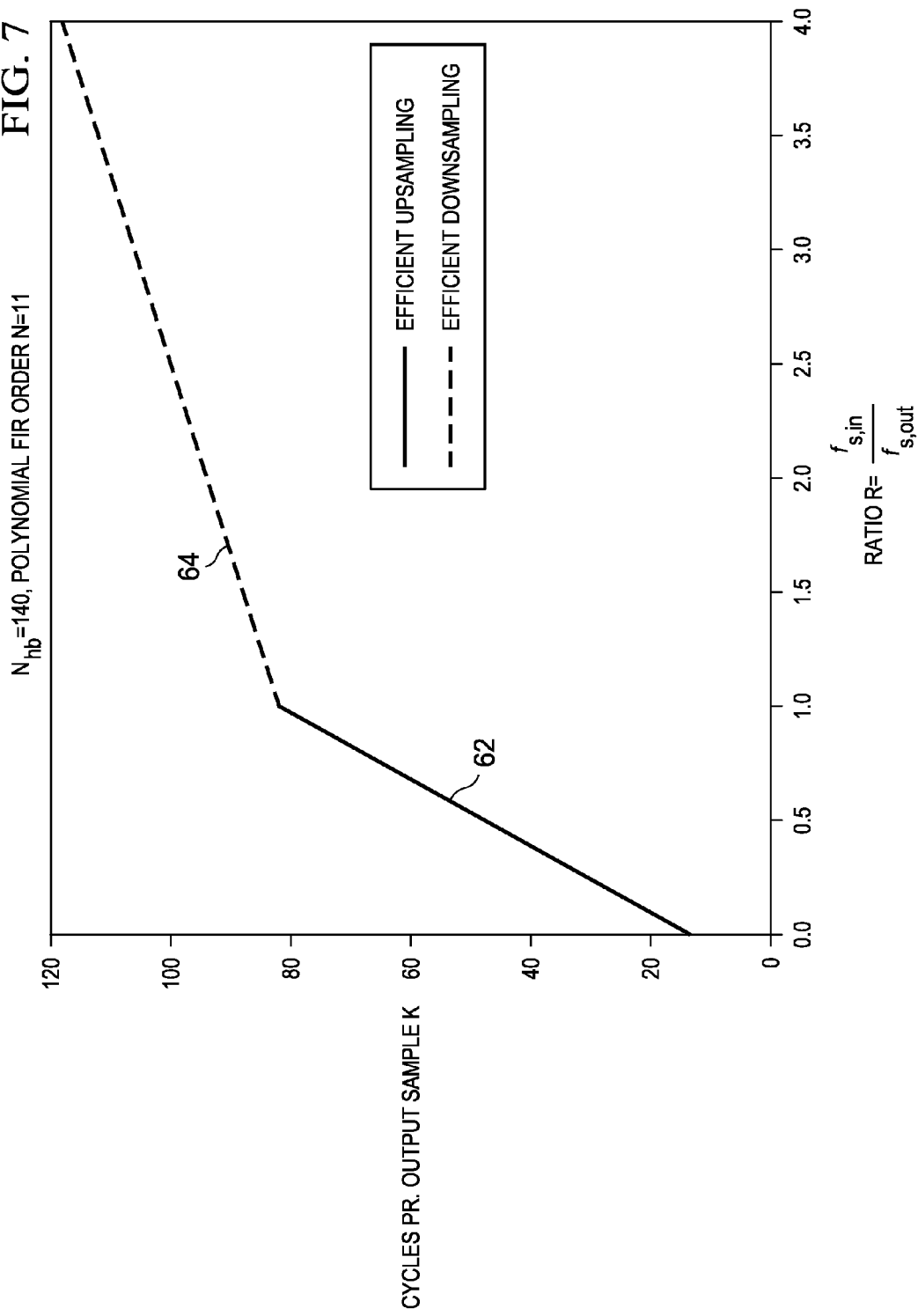

EFFICIENT ASYNCHRONOUS SAMPLE RATE CONVERSION

CROSS-REFERENCE TO RELATED APPLICATIONS

This application claims priority, under 35 U.S.C. §119(e), of U.S. Provisional Application No. 61/074,100, filed Jun. 19, 2008, incorporated herein by this reference.

STATEMENT REGARDING FEDERALLY SPONSORED RESEARCH OR DEVELOPMENT

Not applicable.

BACKGROUND OF THE INVENTION

This invention is in the field of digital audio systems, and is more specifically directed to sample rate conversion in such digital audio systems.

Digital signal processing techniques are widely implemented in a wide range of modern-day electronic systems. Tremendous increases in the switching speed of digital circuits have enabled digital signal processing to replace, in large part, analog circuits in many applications. Modern digital signal processing are sufficiently capable that digital techniques have become widely implemented in audio electronic applications, indeed to such an extent that audio-visual receivers can now be realized nearly entirely in the digital domain.

Modern digital audio-visual receivers and digital audio receivers are typically required to be capable of receiving audio input from a wide variety of sources. For example, a typical digital audio amplifier can receive, process, and amplify audio signals from an AM/FM radio tuner (which may be built into the receiver), analog line-in inputs receiving analog audio from an external source, optical or other digital line-in inputs receiving audio signal from a satellite or cable television source, digital audio signals from a CD player, uncompressed and encrypted digital streams from a set-top box or computer over a High Definition Multimedia Interface (HDMI), and still other sources. Because these digital receivers process the audio signals in the digital domain, the incoming audio signals must be either received in digital form, or converted from analog signals to digital signals. In either case, the resulting digital representation of the audio signals to be processed is in the form of a datastream of digital words (typically sixteen, twenty, or twenty-four bits in width), each digital word having a value corresponding to the amplitude of a sample of the audio signal at a sample point in time. To satisfy the Nyquist theorem, the sample rate of the digital audio sample stream must be at least twice the highest frequency of interest (the Nyquist frequency) of the represented audio signal.

As is well known in the art, the sample rates of signals presented by these various digital audio signal sources vary widely. For example, CD players typically generate 44.1 kHz datastreams and MP3 players use multiple sample rates ranging from 22.05 kHz up to 48 kHz (and can jump from one sample rate to another on a track-by-track basis), while DVD players typically generate digital audio at a 48 kHz sample rate. Digital audio communicated according to the HDMI standard is in the form of up to eight channels of 24-bit audio at sample rates of up to 192 kHz. In general, modern digital audio systems and digital audio-visual receivers are expected to be capable of receiving input digital audio signals at sampling rates ranging from as low as 8 kHz to as high as about 200 kHz.

The power output stages of modern digital audio receivers are implemented as "class D" digital amplifiers, which respond to pulse-width modulated binary drive signals. These pulse-width modulated signals are typically at very high frequencies, on the order of hundreds of kHz, to provide a wide dynamic range in the audio output driving the loudspeakers. Modern digital audio receivers are thus faced with the task of processing input audio signals, from any of these various signal sources, into pulse-width modulated output signals. The tasks involved in this processing are typically quite substantial, including digital filtering and other digital functions such as equalization, phase compensation, and the like, as well as the pulse-width modulation of the output signals.

Conventional digital audio receivers dealt with the varying input sample rates by processing the digital audio signal at its received sample rate, whatever it may be depending on the selected input signal source. However, the digital signal processing techniques now used in many audio receivers has become more capable and thus more complex over time. The computational complexity required to perform this highly complex digital signal processing, at any one of a number of varying sample rates, has therefore exploded. This trend in computational complexity has become compounded by the higher sample rates such as those for HDMI audio signals, especially if the complex digital signal processing is to also be carried out at those high sample rates. As such, the limiting factor in modern high performance digital audio systems is the processor cycle count required for this complex processing, considering that the sample rates can be as high as 192 kHz.

Therefore, rather than perform this complex digital signal processing at the sample rate of the input signal, which varies from source to source, modern digital audio receiver systems now perform sample rate conversion to convert a discrete sampled input signal at one sample rate to a sampled signal at another sample rate. Through the use of sample rate conversion, the input signals from various audio sources, at varying sample rates, can all be converted to a common sample rate at which the digital signal processing is performed. This greatly reduces the computational complexity and hardware cost of the digital audio processor functions in the receiver.

For the special cases in which the ratio of the input and output sample rates to and from the sample rate conversion can be expressed as a ratio of relatively small integers, sample rate conversion can be carried out by a relatively simple circuit or digital signal processor (DSP) software routine. Sample rate converters of this type apply a sequence of upsampling and interpolation of the input signal, creating an intermediate signal at a sample rate that is a common multiple of the input and output sample rates, followed by downsampling of the interpolated intermediate signal at the desired output sample rate. To prevent aliasing or images in the converted output signal, the interpolation is implemented by way of a digital filter that band-limits the result of the upsampling, or band-limits the signal that is to be downsampled. In general, the cutoff frequency of the interpolation filter depends on the lower of the input sample rate and the output sample rate; more precisely, this cutoff frequency is preferably at the lower of the input and output "folding" frequencies (i.e., ½ of the lower one of the input and output sample rates; the folding frequency is also often referred to, confusingly, as the "Nyquist frequency" in the digital domain).

However, the input frequency does not always have such a convenient relationship to the digital signal processing or output frequency. This is increasingly the case for modern digital audio receivers that receive input digital audio signals over a wide range of sample rates, as discussed above. In addition, the input sample rate can vary over time, either by way of drift or because of a change in the source of the input sample stream; in these cases, the sample rate conversion ratio also varies with time. To address these factors, sample rate conversion functions referred to as "asynchronous" sample rate converters are known in the art, and are capable of converting the sample rate of the signal over a wide range of ratios, and of tracking changes in the conversion ratio over time. Conceptually, asynchronous sample rate conversion can be considered as filtering the input signal with a continuous-time low-pass filter to form, in effect, an analog representation of the input sample stream. This conceptual analog signal can then be resampled at the desired output sample rate. Again, the cutoff frequency of the low-pass filter of an asynchronous sample rate converter depends on the lower of the folding frequencies of the input and output sample rates.

In carrying out this function, modern conventional asynchronous sample rate converters reject jitter in the input data stream. By constructing the asynchronous sample rate converter so that it changes its conversion ratio very slowly (e.g., by implementing an extremely low cut off low-pass filter in the ratio-tracker algorithm), higher-frequency jitter in the input sample stream will effectively be rejected. This eliminates the need to obtain jitter reduction through a complex phase-locked loop with low bandwidth (which would necessitate large external components and other complexities). Asynchronous sample rate converters of this type are thus quite beneficial in the receipt and processing of high-jitter sample data, such as are often involved in HDMI signals, which are based on video clocks, and in packet-based audio streaming over USB, IEEE1394, Ethernet etc., in which the packet data is buffered in a FIFO. The ratio tracking provided by asynchronous sample rate conversion can also perform the difficult task of reconstructing an audio clock from the single-signal data stream (clock and data on the same physical input line) in SPDIF (SONY-Philips Digital Interface Format) audio receivers.

FIG. 1a illustrates the concept of asynchronous sample rate conversion. In this example, input discrete-time sample stream x[n] has a sample rate $f_{in}$, which is at least at twice the Nyquist frequency of the information conveyed by that sample stream. This sample stream x[n] corresponds to a band-width limited continuous-time signal x(t) that is sampled at a sample rate $f_{in}$. Conceptual asynchronous sample rate converter (ASRC) 2 includes continuous-time filter 3, which applies an ideal transfer function H(f) to sample stream x[n], producing a continuous-time intermediate signal based on input sample stream x[n]. Resampler 4 samples the continuous-time signal output from filter 3 at the desired output sample rate $f_{out}$, to produce the output discrete-time signal y[m] at sample rate $f_{out}$. In effect, this conceptual ASRC operates as a digital-to-analog converter, running at the input rate and applying an ideal low-pass filter H(f), that feeds an analog-to-digital converter that is sampling at the output rate.

Ideally, the transfer function H(f) of filter 3 will interpolate between the samples x[n], passing information within the sample stream up to a maximum frequency of interest $f_a$, while suppressing aliasing within critical bands at the output sample frequency $f_{out}$ and its multiples. In this ideal case, the amplitude characteristic |H(f)| will pass frequency components from DC to the maximum frequency of interest $f_a$, and will suppress frequency components in aliasing bands of width $2f_a$ centered at output sample frequency $f_{out}$ and its multiples. Such a transfer function H(f) of filter 3 corresponds to a low-pass filter with a cut-off frequency $f_{co}$ lower than one-half of the input sample rate $f_{in}$ in order to avoid aliasing in the sample. In addition, this cut-off frequency $f_{co}$ must be lower than one-half of the output sample rate $f_{out}$ to avoid image components from leaking into the output signal. Accordingly, transfer function H(f) must have a cut-off frequency $f_{co}$ below the lesser of $f_{in}/2$ and $f_{out}/2$, specifically the lower of the two Nyquist frequencies for the input and output signals. Assuming proper implementation of its transfer function H(f), in the case in which the desired output sample rate $f_{out}$ is higher than the input sample rate $f_{in}$ (i.e., ASRC 2 is upsampling), filter 3 enables a perfect reconstruction of the original continuous-time signal x(t), having a maximum frequency of interest $f_a$, at the output of filter 3. If the input sample rate $f_{in}$ is higher than the desired output sample rate $f_{out}$ (downsampling), filter 3 will remove high-frequency information in the input sample stream x[n] that would otherwise be reflected as aliasing in the eventual discrete-time signal y[m].

The conceptual approach of FIG. 1a is conventionally implemented by constructing a digital filter that performs the function of continuous-time filter 3 and of resampler 4. In practice, modern asynchronous sample rate converters following the concept of FIG. 1a typically do not reconstruct the entire continuous-time intermediate signal, but instead calculate only those sample values sufficient to construct the discrete-time signal y[m]. As known in the art, this is accomplished with reference to an impulse response h(t) that has the desired corresponding transfer function H(f). The digital filter realizing this impulse response in combination with the resampling function can be realized by evaluating the filter coefficients h at times depending on the output sample times m in the output sample sequence y[m]:

$$y[m] = \sum_n x[n]h[mT_{out} - nT_{in}]$$

where the periods $T_{in}$ and $T_{out}$ correspond to the input and output sample periods, respectively. From the above equation, this filter has variable coefficients $b_{n,m}$ that depend on the particular output sample m:

$$b_{n,m} = h[mT_{out} - nT_{in}]$$

Given the above, the combination of filter 3 and resampler 4 can be readily realized with a conventional digital signal processor or other logic, although because the filter coefficients vary from output sample to output sample, these coefficients must either be calculated on-the-fly, be retrieved from a look-up table, or a combination of the two. Also, in practice, filter 3 is realized as a finite impulse response (FIR) filter, with a unit impulse response h[m] that is of finite length.

While this conceptual approach is effective in performing asynchronous sample rate conversion, its direct implementation is not practical, because the filter transfer function H(f) must necessarily be very sharp. This sharp characteristic, in frequency, of course results in a very long impulse response h(t) that, in the digital realization, requires a large number of taps to be calculated for each output sample.

FIG. 1b illustrates the construction of a popular conventional asynchronous sample rate converter that addresses the problem by way of a fully digital interpolator based on a very simple continuous time filter, namely a zero-order hold network. In this construction, filter 3 of the conceptual ASRC 2 of FIG. 1a is realized by an interpolator 3', which generates an intermediate continuous-time signal from the input signal x[n]. Resampler 4 then re-samples this intermediate signal at the desired output sample rate $f_{out}$. In this approach, interpolator 3' is realized by the functional sequence of upsampler 5, discrete-time low-pass filter 6, and zero-order hold network (or filter) 7. Upsampler 5 upsamples the input sample stream x[n] by inserting L−1 zeroes ("zero-padding") between each input sample, producing a discrete time signal at a sample rate of L times the input sample rate $f_{in}$. This zero-padded signal is filtered by low-pass filter 6, typically a digital filter operating at a sample rate corresponding to the upsampled sample rate $Lf_{in}$ and having a cutoff frequency at the lower of the input sample rate $f_{in}$ and the output sample rate $f_{out}$. Zero-order hold function 7 effectively converts the interpolated signal from filter 5 into a "stair-case" signal, which is then sampled at the desired output sample rate $f_{out}$ by resampler 4, to produce output discrete-time signal y[m]. In practice, the arrangement of FIG. 1b is functionally equivalent to selecting the most recent sample value output by filter 6 as the current output sample y[n] in the sequence.

Typically, the upsampling factor L of conventional asynchronous sample rate converters is an extremely high number, for example on the order of one million, resulting in an effective sample rate of on the order of 50 GHz or more. Of course, such an extremely high sample rate is impractical to realize. Accordingly, conventional asynchronous sample rate conversion functions in fact do not actually upsample, but instead perform the calculations necessary to "conceptually" upsample and interpolate the incoming signal stream, and select the relevant samples, which are the samples nearest in time to the desired sample points at the output sample rate. While the number of taps in filter 6 increases proportionally with upsampling factor L, only a relatively small subset of these taps are active for any given output sample, because of the abundance of zero-valued input samples in the upsampled zero-padded input stream. Filters applying such subsets of taps are typically referred to in the art as "polyphase" filters, in which the number of active taps is roughly independent of factor L (the number of subset filters increases with increasing L, but the length remains approximately constant). In practice, these filters operate by performing the tap calculation at the lower input sample rate $f_{in}$, and applying the relevant polyphase subfilter for the desired output sample.

While physically realizable, however, the number of potential taps of digital filter 6 necessary for modern asynchronous sample rate conversion requires a huge memory (typically read-only memory) to store the filter coefficients, substantial computational capacity to calculate these coefficients "on the fly", or some combination of the two. This complexity is, of course, expensive to implement. Furthermore, the time-domain error, or "jitter" resulting from the selection of the closest sample, which in effect is "rounding off" in time, can adversely affect the system performance. For example, a jitter of about 20 psec is inherent in asynchronous sample rate conversion at an effective sample rate of 50 GHz. For the example of a full scale 96 kHz audio input signal (such as is possible in a modern high-performance system capable of sampling at 192 kHz), this 20 psec error in sampling time is only about 98 dB down from full scale. Unfortunately, 24-bit resolution requires sampling time error (i.e., jitter) to be at a level of no more than −144 dB from full scale; this requires the jitter to be less than about 0.1 psec for a 96 kHz full scale signal. To achieve this jitter level, the effective sample rate must be on the order of 10 THz, which necessitates a prohibitively high upsampling factor L.

Upsampling factor L can be lowered by replacing the zero-order hold network 7 with a more advanced, higher-order, continuous-time filter. As fundamental in the art, hold network 7 of interpolator 3' in FIG. 1b produces a staircase type output signal. In the time-domain, the impulse response of zero-order hold network 7 is a rectangular window function that spans $1/(L \cdot f_{in})$ in time. In the frequency domain, the transfer function of hold network 7 is a sinc function with an infinite number of transmission zeros, each located at all multiples of $L \cdot f_{in}$. These zeros (i.e., notches) are centered directly at the images (spectral repetitions) of the output of filter 6. FIG. 1c illustrates an example of an ASRC in which a higher-order hold filter 7' is used in place of a zero-order hold network in interpolator 3". For example, the next-most advanced filter 7' is a linear interpolator, which will connect the upsampled sample values output from filter 6 with straight lines in the time domain. As known in the art, a linear interpolator can be achieved by filtering the output of a first sinc filter with another sinc filter; this gives a triangular impulse response that spans $2/(L \cdot f_{in})$. The linear interpolator thus gives far more attenuation of the images of the output of filter 5 about its notches in the frequency domain; as a result, the upsampling factor L can be reduced from that used with the zero-order hold filter, to achieve the same performance. This approach can be further extended by realizing filter 7' by even higher order filters, providing more and more bell-shaped impulse responses and deeper and deeper notches with increasing order, such deeper notches enabling further reduction in the upsampling factor L, for a given level of performance. The class of $n^{th}$ order hold filters is referred to as B-spline interpolators. The impulse response of an $n^{th}$ order B-spline interpolator is a piece-wise polynomial, with the $n^{th}$ order impulse response consisting of n polynomial sections, each of order n−1. Evaluation of an output sample by way of a B-spline interpolator is obtained by way of an FIR filter operation with n+1 taps, with each filter coefficient calculated by evaluation of a polynomial. Many other interpolation functions other than B-splines are known, including the well known Lagrange interpolation function, and the polynomial interpolation filter described in commonly assigned U.S. application Ser. No. 12/210,794, filed Sep. 15, 2008. Fractional delay filters are also known in the art, as a form of digital filter that is equivalent to some continuous time filter, and that interpolates between samples using a tunable delay.

The conventional asynchronous sample rate converter approaches shown in FIGS. 1b and 1c perform reasonably well for those cases in which the ratio R of input sample rate $f_{in}$ to output sample rate $f_{out}$ is below unity (i.e., in the upsampling case). In the upsampling case, the cutoff frequency of filter 6 follows the input sample rate $f_{in}$, as it is a lower frequency than the output sample rate $f_{out}$. However, it has been observed, according to this invention, that this conventional arrangement requires substantial computational complexity if the ratio R exceeds unity (i.e. in the downsampling case), primarily because the cutoff frequency of filter 6, relative to its sample rate of $L \cdot f_{in}$, must follow the output sample rate $f_{out}$, which requires its cutoff frequency to change with changes in the output sample rate. In contrast, the filter cutoff frequency remains constant, relative to the filter sample rate, in the up-sampling case. In order for the filter cutoff frequency to follow the output sample rate in the downsampling case, a more complex (i.e., more poles and zeroes) digital filter is required, with a corresponding increase in the number of taps (if realized as an FIR filter), in order to realize the smaller relative transition band necessary for changes in cutoff frequency. Not only does the number of taps in the FIR realization increase, but because the sampling rate of this filter increases proportionally with the ratio R, the computational complexity per output sample of the filter itself increases with the square of the increase in the ratio R. In addition, this computational complexity is further increased by the necessity to recalculate filter coefficients with changes in the output sample rate, or to store those coefficient values in memory in advance.

Another known approach to asynchronous sample rate conversion includes an interpolation filter, a resampler, and a decimator in series. In this approach, the interpolation filter receives, upsamples, and low-pass-filters the input signal, producing a result that is buffered in a FIFO at the upsampled sample rate. This intermediate continuous-time signal from the FIFO of the upsampler is resampled by way of an interpolation filter that has stopbands at multiples of a resampling frequency $L \cdot f_{out}$. The resampled signal is decimated by a factor L to produce the sample rate converted signal at the desired output sample rate. The decimator is realized by a steep digital low-pass filter with a cut-off frequency at the lower of the Nyquist rates of the input and output signals, to remove aliasing and images, and which outputs every $L^{th}$ sample of the filtered signal. The frequency response of the digital decimation filter is periodic with the resampling rate $L \cdot f_{out}$, with stop bands at multiples of $L \cdot f_{in}$. While this approach enables the interpolation filters to be relatively simple linear interpolation filters, a very high decimation factor is required at the output of the sample rate converter. In addition, the decimation filter of this approach becomes extremely complex if the input sample rate is low relative to the output sample rate (i.e., in the case of strong upsampling). This complexity is because the stopbands of the decimation filter must block those images of the input signal that are at a lower rate than the eventual output sample rate ($L \cdot f_{in} < L \cdot f_{out}$). Reduction of the cut-off frequency of this filter, relative to the filter sampling rate, in the downsampling case is reflected in a smaller relative transition band and thus a more complex filter (i.e., more taps, if realized as an FIR filter). Moreover, the filter coefficients must be recalculated each time that the ratio R changes.

By way of further background, the use of fractional delay filters in sample rate conversion from an input sample rate to a higher output sample rate (i.e., upsampling) is described in Rajamani, et al., "An Efficient Algorithm for Sample Rate Conversion from CD to DAT", *Signal Processing Letters*, Vol. 7, No. 10 (IEEE, October 2000), pp. 288-290.

BRIEF SUMMARY OF THE INVENTION

Embodiments of this invention provide asynchronous sample rate conversion circuitry and a method that provides improved efficiency in converting input discrete time sequences to a constant sample rate over a wide range of input sample rates, including both upsampling and downsampling.

Embodiments of this invention provide such circuitry and a method in which the computational complexity of the digital filters can be kept modest.

Embodiments of this invention provide such circuitry and a method in which the efficiency of the sample rate conversion in both the upsampling and downsampling cases can be optimized.

Embodiments of this invention provide such circuitry and a method in which recalculation of filter coefficients is minimized.

Embodiments of this invention provide such circuitry and a method in which jitter from the input signal is suppressed at the output.

Embodiments of this invention provide such circuitry and a method in which digital audio processing operations downstream from the asynchronous sample rate converter can operate at a constant rate, regardless of the input source.

Other objects and advantages provided by embodiments of this invention will be apparent to those of ordinary skill in the art having reference to the following specification together with its drawings.

This invention may be implemented into asynchronous sample rate conversion functionality that operates according to different algorithms for the upsampling and downsampling cases. For those input sources having a sample rate below the desired output sample rate (i.e., upsampling, or $R=f_{in}/f_{out}<1$), the input signal is upsampled by a fixed factor L to a rate of $L \cdot f_{in}$, and then filtered and resampled. Conversely, for those input sources having a sample rate above the desired output sample rate (i.e., R>1), a resampling filter is first applied to the selected input signal, followed by fixed decimation to the desired output sample rate. In both of the upsampling and downsampling cases, the resampling filter is a finite impulse response filter that has its coefficients calculated by evaluating polynomial representations of the impulse response, at times within the duration of that response corresponding to the phase difference between the input sample times and the desired output sample time.

BRIEF DESCRIPTION OF THE SEVERAL VIEWS OF THE DRAWING

FIG. 2 is an electrical diagram, in block form, of a digital audio receiver constructed according to an embodiment of the invention.

FIG. 5a is a flow diagram illustrating the operation of defining piece-wise polynomial expressions of the resampling filter impulse response, according to embodiments of the invention.

FIG. 5e is a flow diagram illustrating the operation of calculating FIR coefficients, using the polynomial expressions of the resampling filter impulse response, used by the resampling filter for determining an output sample value, according to embodiments of the invention.

FIG. 7 is a plot illustrating the computational complexity of filtering operations in an asynchronous sample rate converter according to an embodiment of the invention, relative to the resampling ratio of input sample rate to output sample rate.

DETAILED DESCRIPTION OF THE INVENTION

Figure 1A:
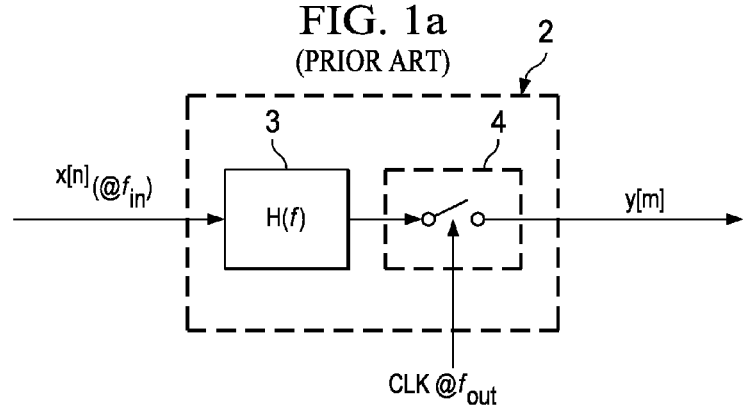
FIG. 1a is an electrical diagram, in block form, of the concept of asynchronous sample rate conversion.

This invention will be described in connection with its embodiments, namely as implemented into asynchronous sample rate conversion circuitry and its operation in a digital audio receiver, because it is contemplated that this invention will be especially beneficial in such an application. However, it is contemplated that this invention will also provide important benefits in other applications and uses. Accordingly, it is to be understood that the following description is provided by way of example only, and is not intended to limit the true scope of this invention as claimed.

FIG. 2 illustrates an example of the construction of audio processing circuitry in digital audio receiver 10 according to the preferred embodiment of the invention. Receiver 10 may be implemented into an audio-video receiver, in which case video data paths (not shown) will also be provided, substantially in parallel with the audio processing functions shown in FIG. 2.

Receiver 10 receives multiple sources of audio signals for processing by its digital audio processor 12 into a pulse-code-modulated (PCM) signal, and from that PCM signal into pulse-width-modulated (PWM) output signals that drive the eventual audible output. In this example, asynchronous sample rate converter (ASRC) 15 receives digital audio from DVD/CD controller 14a, such audio corresponding to audio content in conjunction with DVD movies or audio CDs played on a player (not shown) to which receiver 10 is connected. Optical line-in receiver 14b provides digital audio, for example from satellite or cable television sources, to another input of ASRC 15. Other digital inputs are also provided to ASRC 15, as suggested in FIG. 2. In this regard, it is contemplated that the sample rates of the various input sample streams (i.e., discrete time signals) vary over a relatively wide range. For example, the output of DVD/CD controller 14a for CD audio is typically at a sample rate of 44.1 kHz, while the audio output for DVD audio is at a sample rate of 96 kHz. Other input sources, such as digital radio, digital audio tape, digital signals from a computer or MP3 player, and the like can provide audio signals at varying sample rates. As such, modern digital audio receivers, such as receiver 10, are capable of receiving digital audio at sample rates ranging from 11 kHz to as high as 192 kHz (for DVD-A audio). The output of ASRC 15, which in this case is at a sample rate of 48 kHz, is applied to one input of multiplexer 16.

Receiver 10 according to this embodiment of the invention is also capable of receiving conventional analog audio signals. In this regard, analog-to-digital converter (ADC) 14c converts analog stereo signals from analog line-in inputs CH_IN and from tuner 13 to a digital datastream, and provides this datastream to another input of multiplexer 16. Because the sampling frequency of ADC 14c can be selected by the system designer, that sampling frequency will typically be selected to match the frequency at which digital audio processor 12 operates (e.g., 48 kHz), thus avoiding sample rate conversion for that input. Of course, if for some reason the output of ADC 14c were at a different sample rate, these signals would also be applied to ASRC 15. Multiplexer 16 chooses one (or both) of these inputs for application to digital audio processor 12, under the control of system controller 30. The audio source selected by ASRC 15 and multiplexer 16 is under user control; in this regard, system controller 30 receives direct selection inputs from front panel switches 25 of receiver 10, or infrared remote control signals via infrared receiver 27, both communicating with system controller 30 via interface circuitry 28.

Digital audio processor 12 is a conventional integrated circuit, or integrated circuit core, for decoding and digitally processing the digital audio signals from multiplexer 16. Alternatively, digital audio processor 12 may be implemented as part of a larger-scale integrated circuit for decoding and processing digital video and audio signals, an example of which is an MPEG-2 decoder implemented using a digital signal processor such as from the DA610 class of digital signal processors available from Texas Instruments Incorporated. In either case, examples of functions performed by digital audio processor 12 include decoding of the incoming digital data, applying the various digital audio data to corresponding channels supported by receiver 10, applying digital filters, and formatting the digital audio data into a pulse-code-modulated (PCM) format. The PCM signals for each channel are then forwarded to pulse-width-modulation (PWM) audio processor 20. An additional interpolation function may be provided between digital audio processor 12 and PWM audio processor 20 (or included within PWM audio processor 20), to increase the sample rate (e.g., by a factor of eight) to the desired pulse-width modulated frequency (e.g., 384 kHz).

PWM audio processor 20 is a conventional device for converting the PCM digital audio signals at its inputs to corresponding pulse-width-modulated (PWM) signals output signals for four channels, in this example. For each of these four channels, PWM audio processor 20 produces separate PWM control signals that are applied to a corresponding power amplifier stage $22_1$ through $22_4$, each of which drives a respective one of loudspeakers SPKR_1 through SPKR_4, as shown in FIG. 2. Of course, more or fewer channels may be supported by receiver 10. PWM audio processor 20 preferably includes conventional circuitry for controlling the volume of the audio output, performing the conventional functions of parametric speaker equalization or "voicing", implementation of graphic equalizer presets, treble and bass adjustment, and precision soft volume control on the audio signal being processed for its channel. Other digital functions that can be performed by PWM audio processor 20 include loudness compensation to boost bass frequencies when the output for the channel is low, dynamic range compression, background noise floor compensation or noise squelch, center or sub-woofer channel synthesis, programmable dither, peak limiting and clipping, and other digital filter processing. An example of circuitry and functionality for converting the PCM digital audio signals to PWM output signals is described in copending and commonly assigned application Ser. No. 12/127,173, filed May 27, 2008, incorporated herein by this reference.

In FIG. 2, digital audio processor 12, PWM audio processor 20, and ASRC 15 are illustrated as separate functions. It is contemplated, however, that these digital functions may be readily integrated into a single integrated circuit, and indeed such integration is preferred for the benefits of reduced manufacturing cost, improved device matching, and the like. Of course, these functions may alternatively be realized in separate integrated circuits, as appropriate for the particular system implementation.

As mentioned above, system controller 30 provides audio source selection signals to ASRC 15 and multiplexer 16, and channel volume control signals to PWM audio processor 20. System controller 30 also provides other control signals throughout receiver 10, including channel selection control to tuner 16 in response to user inputs received via front panel 25 or infrared receiver 27, and operational control signals applied to digital audio processor 12.

Figure 3:
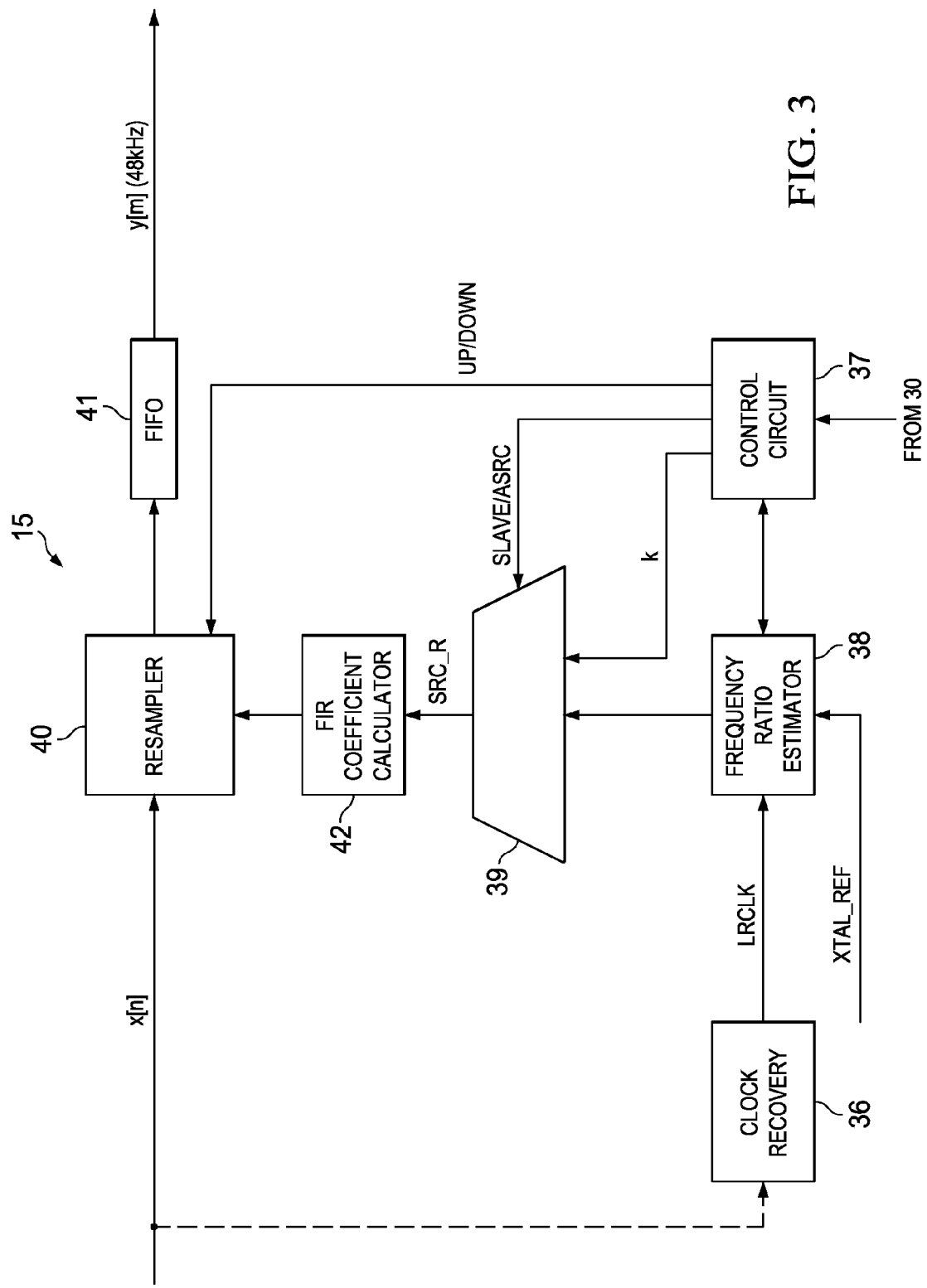
FIG. 3 is an electrical diagram, in block form, of the construction of the asynchronous sample rate converter of the receiver of FIG. 2, constructed according to an embodiment of the invention.

Referring now to FIG. 3, the construction of ASRC 15 according to the preferred embodiment of the invention will now be described. As evident from FIG. 2, digital input sample streams are received over a wide range of sample rates, in this example, ranging from as low as 8 kHz to as high as 200 kHz. The task of ASRC 15 in this embodiment of the invention is to convert the sample rate of the selected input signal x[n] to a signal y[m] at a fixed sample rate for processing, by digital audio processor 12, into the signals that drive loudspeakers SPKR_1 through SPKR_4 in this system. As mentioned above, it is convenient and efficient for digital audio processor 12 and the remainder of the digital circuitry to operate at a fixed sample rate, regardless of the audio input source. According to this embodiment of the invention, ASRC 15 converts its received input sample stream from its input sample rate to a sample stream at the desired output sample rate.

As will be evident from the following description, ASRC 15 is realized by way of digital logic circuitry. Those skilled in the art having reference to this description will comprehend that this digital logic circuitry may correspond to programmable logic, preferably a digital signal processor (DSP), because DSPs and similar devices are designed to efficiently perform operations such as digital filters and other digital signal processing routines. In this case, program memory will be provided with the DSP device, to store the software routines involved in performing the functions of ASRC 15 described in this specification; it is contemplated that those skilled in the art having reference to this specification will be readily able to program such software routines involved in the asynchronous sample rate conversion described herein. Examples of DSP devices suitable for realizing ASRC 15 include the AUREUS audio DSP devices, and other implementations of the TMS320C6000 DSP architecture, available from Texas Instruments Incorporated. Such high-performance DSP solutions may also be used to perform the functions of digital audio processor 12, in the system of FIG. 2, along with the functions of ASRC 15. Alternatively, separate DSP circuitry may be provided for ASRC 15. Further in the alternative, custom or dedicated logic circuitry may be used to realize ASRC 15, instead of or in combination with DSP or other programmable logic circuitry. It is contemplated that those skilled in the art having reference to this specification can readily realize the optimal circuit arrangement for ASRC 15 for particular digital audio applications.

As evident from the foregoing description, the task of ASRC 15 is to convert the sample rate of any selected one of the digital audio input signals to a common output sample rate, regardless of the source and sample rate of the selected digital input signal, and thus regardless of whether the input sample rate is lower than or higher than the output sample rate. According to the preferred embodiment of the invention, ASRC 15 applies a different algorithm in the upsampling ($f_{in} < f_{out}$) case from that applied in the downsampling case ($f_{in} > f_{out}$), so that sample rate conversion is performed efficiently in either case. In addition, a shared digital filter functionality is used in each case, which enables the filter to be relatively complex yet readily adaptable for efficient performance in both upsampling and downsampling.

The following description will often refer to the example of 48 kHz for this fixed output sample rate of the signal output by ASRC 15. It will of course be understood, by those skilled in the art having reference to this description, that this output sample rate can be at any convenient sample rate for the processing circuitry. As such, the references of this ASRC output sample rate as being at 48 kHz are not intended to limit the scope of this invention as claimed, and should not be understood by the reader as so limiting.

Referring to FIG. 3, the discrete time signal input signal x[n] is applied to resampler 40. According to this embodiment of the invention, resampler 40 operates according to one filtering and resampling algorithm if the input signal is at a lower sample rate than the desired output sample stream (i.e., upsampling), and according to a different filtering and resampling algorithm if the input signal is at a higher sample rate than the output sample stream (i.e., downsampling). In this embodiment of the invention, control circuit 37 receives the sensed frequency ratio from frequency ratio estimator 38 (described below), and issues a control signal up/down to resampler 40, to select the operating algorithm that will be executed in converting the selected incoming sample stream. In either case, resampler 40 produces output sample stream y[m] at the desired output sample rate, e.g. 48 kHz, which is forwarded on to digital audio processor 12 (FIG. 2) for processing of the audio signal and its content.

The relationship between the input and output sample rates is therefore important in determining the manner in which ASRC 15 operates. According to this embodiment of the invention, frequency ratio estimator 38 determines this relationship. Frequency ratio estimator 38 is preferably implemented as an adaptive low-pass digital filter that converges to a very low cutoff frequency. The input to this low-pass digital filter is preferably a sequence of "time-stamps", meaning time base values at which input samples are received, as indicated by clock signal LRCLK. In this embodiment of the invention, the sample rate of the selected input audio signal is represented by clock signal LRCLK, as shown in FIG. 3, which is a clock signal that is synchronous with the input sample stream, and that has a frequency corresponding to the sample rate of that input sample stream. Clock signal LRCLK may be a clock signal received along with the sample stream, or alternatively may be recovered from the sample stream by clock recovery circuit 36 of FIG. 3, for example if the input sample stream is in a modulated format such as SPDIF. In any case, clock signal LRCLK is synchronous with the selected input audio sample stream. This clock signal LRCLK is applied to frequency ratio estimator 38, along with a time base defined by reference clock signal XTAL_REF, which is based on a crystal oscillator or some other reference clock signal. Circuitry within frequency ratio estimator 38, such as a digital counter, counts cycles of reference clock signal XTAL_REF; the sequence of output values from this counter, at times at which a cycle of clock signal LRCLK is detected (i.e., the sequence of "time stamps"), is applied to an adaptive low-pass digital filter, which smoothes the sequence of values to substantially a linear ramp. The adaptive low-pass filter in frequency ratio estimator 38 lowers its bandwidth as it locks to its input signal, ultimately reducing its bandwidth to as low as 0.1 Hz in this example. The slope of the resulting linear ramp corresponds to the period ($T_{sEst}$) of clock signal LRCLK, and thus to the input sample rate; a steep slope indicates a relatively slow input sample rate, while a shallow slope indicates a relatively fast input sample rate. Based on this slope, frequency ratio estimator 38 readily generates a control value indicative of the relationship of the input sample rate to the desired output sample rate from ASRC 15. More specifically, in this embodiment of the invention, frequency ratio estimator 38 passes a value of this time stamp ramp, along with an indication of the slope of the ramp, to FIR coefficient calculator 42 via multiplexer 39. This information is sufficient to calculate the FIR coefficients, because the time stamp ramp value conveys the instantaneous phase relationship of the most recent input sample or samples to the desired output sample, and the output sample time can be derived from the slope value.

According to this preferred embodiment of the invention, the determination of the frequency ratio $R=f_{in}/f_{out}$ by frequency ratio estimator 38 is especially beneficial in reducing the effects of clock jitter, for example jitter caused by clock recovery circuit 36. As mentioned above, the extremely low cutoff frequency of the low-pass filter implemented by frequency ratio estimator 38 effectively assumes that the input data is uniformly sampled (i.e., assumes zero jitter), even though substantial clock jitter and time quantization may in fact be present in the input digital audio signal. This jitter and time quantization error is effectively filtered out by way of frequency ratio estimator 38, even for packet-based transmission protocols such as USB and Ethernet in which the time granularity can be substantial (on the order of msec).

According to this invention, as will be described in further detail below in connection with its preferred embodiments, the approach taken by resampler 40 in deriving the output sample stream y[m] differs from the conceptual approach described above relative to FIG. 1a. In that conventional approach, an FIR filter emulates a continuous-time filter over the entire waveform, from which the desired sample value at the desired sample output time is determined. While that conventional approach enables the filter coefficients to be stored in memory, thus avoiding recalculation of the filter coefficients during operation, the number of stored coefficients can be massive for asynchronous sample rate converters intended to operate over a wide range of sample rates. In contrast, according to this invention, only those filter coefficients that will affect the output sample value near the particular output sample time are calculated and applied by resampler 40. This reduced set of filter coefficients greatly improves the efficiency of the sample rate conversion, as will become evident from this description. And because of the ability of ASRC 15 to apply different algorithms for upsampling and downsampling, as will also be described, the computational capacity required for calculating these filter coefficients is relatively modest, even considering that the coefficient values will depend both on the ratio R of input and output sample rates, and also on the instantaneous phase relationship of the output sample being derived relative to the input sample stream.

According to this embodiment of the invention, therefore, the filter coefficients applied by resampler 40 are calculated for each output sample by FIR coefficient calculator circuitry 42, which may be programmable logic circuitry programmed to perform this function (indeed, as part of the overall DSP architecture implementing FIR digital filter 40, if appropriate) or alternatively may be logic circuitry dedicated to this function. As noted above, the filter coefficients calculated by FIR coefficient calculator 42 are determined by the ratio of the sample rate conversion to be performed by ASRC 15 as indicated on control lines SRC_R from multiplexer 39, and are also determined by the phase applied to FIR coefficient calculator 42 by multiplexer 39. More specifically, the output sample is to be taken at a point in time corresponding to the output sample period (i.e., at a time $t=m \cdot T_{out}$ for the $m^{th}$ output sample, generated at sample period $T_{out}$). The times of the input samples are indicated by the filtered time stamp ramp generated by frequency ratio estimator 38, with the first FIR coefficient calculated by calculator 42 corresponding to the input sample with the largest time stamp value, and as such nearest in time to the output sample time $t=m \cdot T_{out}$. These coefficients are determined, by FIR coefficient calculator 42, based on the instantaneous phase relationship of the output sample being derived, relative to the input sample stream, as indicated on control lines SRC_R from frequency ratio estimator 38.

Multiplexer 39 receives a signal indicating the ratio of input sample rate to output sample rate from frequency ratio estimator function 38, generated in the manner described above. A second input to multiplexer 39 is a constant value k, for use in an optional "fixed ratio" sample rate conversion. According to this invention, it is contemplated that, in some cases, the input sample rate from certain audio sources and the desired fixed output sample rate can be expressed by a ratio of relatively small integers (e.g., integer values of ten or lower). For example, digital audio signals from a miniDV digital video camcorder, from digital audio tape, or from NICAM digital audio, are all at a sample rate of 32 kHz, in which case the ratio $R=f_{in}/f_{out}=\frac{2}{3}$ for an output sample rate of 48 MHz. In that case, the output sample stream can be synchronously converted from the input sample stream, and the input sample clock can be slaved to the output sample clock. If this relationship is present, as determined by system controller 30 from the current user source selection, control circuit 37 in turn issues a constant value corresponding to $R=\frac{2}{3}$ on line k, and drives select line slave/ASRC to cause multiplexer 39 to select the constant value k for application to FIR coefficient calculator 42. In this event, the sample rate conversion effected by ASRC 15 follows conventional upsampling and interpolation of the selected input signal to a sample rate at a common multiple of the input and output sample rates, followed by downsampling by selecting the interpolated samples at the desired output sample rate. The interpolation filter will have its coefficients determined by FIR coefficient calculator 42 for this constant ratio case. It is contemplated that, in this special case, the phase relationship of the output sample to the input sample stream need not be included in the calculation of the FIR coefficients. FIR coefficient calculator 42 will determine these filter coefficients so that the combination of the interpolation or decimation filtering (as the case may be) and the effectively emulated continuous-time filtering becomes a low-pass filter with a cutoff frequency corresponding to the Nyquist frequency ("folding" frequency) of the lower of the input and output sample rates. In this case, FIR coefficient calculator 42 may simply retrieve the coefficients from memory in the conventional manner.

In the more general asynchronous case, the output of frequency ratio estimator 38 is selected by multiplexer 39, in response to control signal slave/ASRC from control circuit 37 indicating asynchronous sample rate conversion (such determination made by control circuit 37 in response to the result generated by frequency ratio estimator 38). According to this embodiment of the invention, control circuit 37 also determines whether the selected input sample rate is above or below the desired output sample rate (e.g., 48 kHz), and issues a control signal on line up/down to resampler 40 accordingly. As mentioned above and as will be described in detail below, resampler 40, and thus ASRC 15 itself, functionally operates according to different algorithms for the upsampling and downsampling cases, under the control of the signal on line up/down issued by control circuit 37; in this embodiment of the invention, these different algorithms are selected by controlling the signal flow within resampler 40, according to whether upsampling or downsampling is to be performed. These different algorithms optimize the efficiency of operation of ASRC 15 in each case, reducing the cost and optimizing performance. ASRC 15 will then operate to perform asynchronous sample rate conversion, as will now be described in detail.

Output sequence y[m] from ASRC 15 is then buffered by FIFO 41. FIFO 41 applies its output to digital audio processor 12, for digital audio processing and eventually driving audio amplifiers 22, in the example of receiver 10 of FIG. 2. Alternatively, FIFO 41 may be placed prior to resampler 40, such that the necessary input samples x[n] are buffered in that advance FIFO and pulled as needed to calculate each output sample value y[m].

Upsampling (R<1)

The operation of ASRC 15 in the upsampling situation, according to this embodiment of the invention, will now be described with reference to FIG. 4*a*. In this upsampling case, the operation of ASRC 15 can be initiated by beginning execution of the corresponding software routine from a corresponding location in its program memory, or by issuing control signals to enable the operation of logic circuits within resampler 40, or by way of other conventional control approaches.

In a conceptual sense, sample rate conversion to a higher sample rate generally involves upsampling and interpolation of the input sample stream by a factor L, followed by conversion to a continuous-time signal, from which a sample at the desired output sample rate is taken. Implementation of this operation in the digital domain is accomplished by of upsampling (zero-padding) of the input sample stream, followed by application of a digital low-pass filter to interpolate the zero-padded signal; another digital filter then evaluates an output sample value at the desired point in time, as if sampling a continuous-time signal.

Figure 4A:
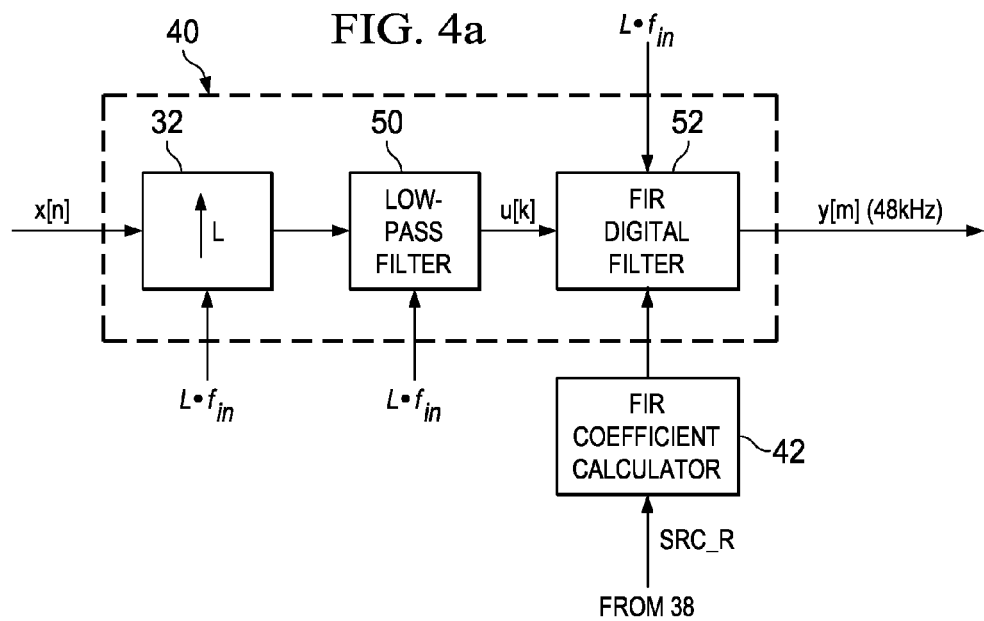
FIG. 4a is an electrical diagram, in block form, illustrating the functional arrangement of the FIR digital filter and resampler function of asynchronous sample rate converter of FIG. 2 in the upsampling case.

FIG. 4*a* illustrates the signal flow through resampler 40 in this upsampling case. The selected input sample stream x[n] is first upsampled (zero-padded) by upsampler 32, using a relatively modest upsampling factor L. For example, upsampler 32 can operate at four times the input sample rate $f_{in}$ (i.e., L=4), in which case the output of upsampler 32 is at four times the sample rate as sample stream x[n]. For most input sources for which upsampling is performed by resampler 40, the sample rate $f_{in}$ will range from between 8 kHz and 48 kHz, and therefore the output of upsampler 32 ranges between 32 kHz and 192 kHz for the example of L=4. Resampler 40 then applies digital low-pass filter 50 to the upsampled output from upsampler 32, filter 50 also operating at the upsampled input sample rate $L \cdot f_{in}$. According to this embodiment of the invention, low-pass filter 50 in the upsampling operation of resampler 40 interpolates values for the zero-padded "upsamples" between the actual input samples at the output of upsampler 32. In this example in which L=4, the output of low-pass filter 50 is a 32 to 192 kHz discrete-time signal that is band-limited to the Nyquist rate of the input signal. This output discrete-time signal is then applied to FIR digital filter function 52, as shown in FIG. 4*a*.

If one considers the output from low-pass filter 50 as discrete sample stream u[k], the function of FIR digital filter function 52, in a conceptual sense, is to convert that sample stream u[k] into a continuous-time signal u(t), apply a continuous time filter with impulse response h(t) to produce a filtered continuous-time signal g(t), and resample that filtered signal g(t) at the output sample rate to produce discrete sample stream y[m]. The conversion of the sample stream u[k] to continuous-time signal u(t) can be expressed as:

$$u(t) = \sum u[k]\delta\left(t - \frac{k \cdot T_{in}}{L}\right)$$

where $T_{in}$ is the sample period of the input signal x[n], and L is the upsampling factor. The impulse response h(t) can be considered as a time-scaled version of a unit filter p(t):

$$h(t) = p\left(t\frac{L}{T_{in}}\right)$$

where the unit filter p(t) is a causal filter with unity DC gain, with notches at multiples of 1 Hz, and having an impulse response of integer duration. As evident from this expression, the time-scaling of this unit filter moves the notches in its frequency response to multiples of $L \cdot f_{in}$; these notches align with the image frequencies of the low-pass filter 50. Consequently, the combination of digital filter 50 and the input response h(t) of filter 52 acts as a continuous-time low-pass filter with cut-off at the Nyquist rate of the input signal. This means that g(t) is a continuous-time reconstruction of the digital input signal x[k]. Moreover, the reconstructed signal g(t) is band-limited to the Nyquist rate of the input sampling rate and can be re-sampled at any rate above the input rate without aliasing. The filtered continuous-time signal g(t) can thus be expressed, in terms of the filtered continuous-time signal u(t), as the convolution integral:

$$g(t) = (u * h)(t) = \int_{-\infty}^{\infty} u(\tau)h(t-\tau)d\tau$$

And also in this conceptual sense, the output sample stream y[m] is derived by sampling the continuous-time signal g(t) at time instants $mT_{out}$, where $T_{out}$ is the output sample period:

$$y[m] = g(m \cdot T_{out}) = \sum_k u[k] \cdot h\left(m \cdot T_{out} - \frac{k \cdot T_{in}}{L}\right)$$

The continuous-time filter response h(t) defines a corresponding set of FIR digital filter coefficients b:

$$b_{m,k} = h\left(m \cdot T_{out} - \frac{k \cdot T_{in}}{L}\right)$$

This expression shows that FIR coefficients $b_{m,k}$ can be readily derived by sampling the impulse response h(t) at the input sampling frequency $L/T_{in}$, at a phase that is defined by the $m^{th}$ output sample $m \cdot T_{out}$ relative to the input sample times. This embodiment of the invention realizes FIR digital filter function 52 in this manner, by evaluating the impulse response h(t) at points in time determined from the phase difference between the output sample time $mT_{out}$ and the input sample times $kT_{in}$.

Stated another way, according to this embodiment of the invention, FIR digital filter function 52 applies a filter having an impulse response h(t) with a duration that spans an integer number N of time intervals, each time interval equal to one input sample period $T_{in}/L$ and thus associated with an (upsampled and filtered) input sample value. According to this embodiment of the invention, the impulse response h(t) is expressed in piece-wise form by an exact or approximated polynomial expression for each of the N time intervals. The FIR coefficients can then be derived by evaluating the polynomial expression for each of the N time intervals, at a point in time within that interval corresponding to the phase offset between the output sample time and the input sample times. Because the N time intervals each have a duration of one upsampled input sample period, the phase offset at which the polynomial is evaluated to determine an FIR coefficient is the same within each interval. In effect, the FIR coefficient calculator 42 (FIG. 4a) can calculate these coefficients by determining the phase offset, evaluating a polynomial for one of the intervals at the corresponding time, and then stepping through each of the other polynomial expressions for the impulse response, evaluating the polynomial at that same phase (or time) offset.

It has been observed, in connection with this invention, that the time-scaling of a unit filter p(t) into a filter impulse response h(t), as described above, ensures that the corresponding frequency response of this filter tracks the input sample rate, preventing both aliasing and imaging in this upsampling case.

Figure 4B:
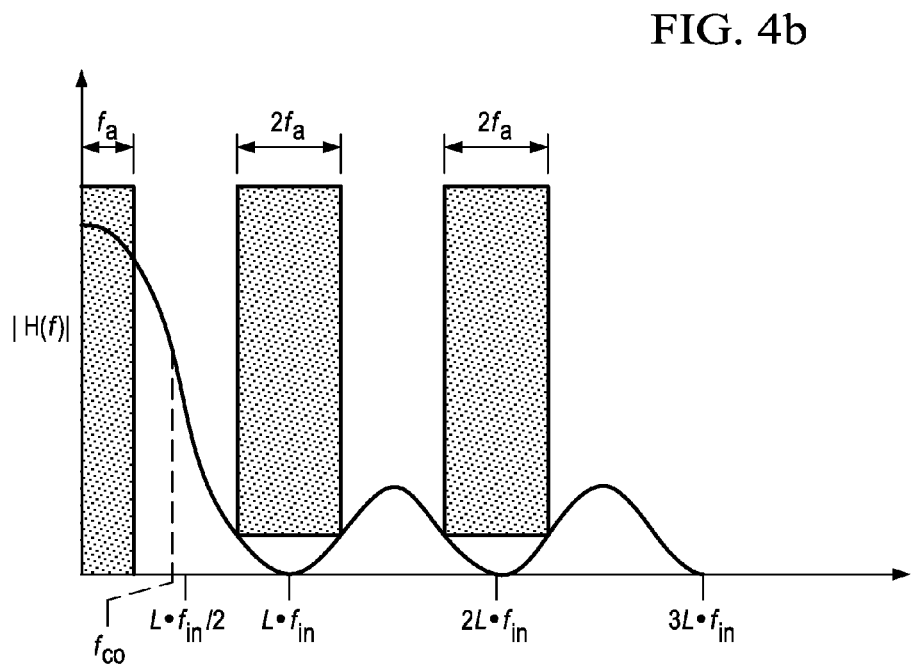
FIG. 4b is a transfer function plot of an idealized resampling filter in the upsampling case, according to an embodiment of the invention.

The frequency response of the filter implemented by FIR digital filter function 52 should have certain characteristics to achieve the function of asynchronous sample rate conversion, according to this embodiment of the invention. As is fundamental in the art, an input sample stream of sample rate $f_{in}$ that has been upsampled by a factor L, and then low-pass filtered, has images centered at frequencies that are multiples of $L \cdot f_{in}$. Referring to FIG. 4b, for a fundamental sample stream that is at a sample rate $f_{in}$ and that is representative of information within a bandwidth $f_a$, upsampling by a factor L will generate images of bandwidth $2f_a$ that are centered at frequencies $kL \cdot f_{in}$. According to this embodiment of the invention, it is therefore useful for the filter approximating the continuous-time conversion, and from which the output sample at the new sample rate will be selected, to have a transfer function with stop bands of bandwidth $2f_a$ at these image center frequencies. An example of the transfer function |H(f)| of this continuous-time filter, which has stop bands centered at frequencies $kL \cdot f_{in}$ (for k=1, 2, . . . ) is illustrated in FIG. 4b.

In addition, the effect of the upsampling and filtering on signal amplitude must also be considered. As known in the art, the upsampling (zero-padding) of a discrete signal stream by a factor L reduces the amplitude of the signal amplitude by a factor L, per unit time. For example, if signal x[k]=1 on average, the upsampled sequence u[k] that is obtained by inserting L−1 zero-padded values for each sample of x[k] will have a mean amplitude of 1/L. However, the effect of low-pass filter 50 on the zero-padded signal results in a pass-band gain of factor L, which exactly compensates for the gain of 1/L inherent in the upsampling. Insofar as impulse response h(t) is concerned, the unit filter p(t) that is the basis of the filter h(t) has unity gain at DC. The time-scaling of unit filter p(t) to the time-scaled response h(t) involves a gain of $T_{in}/L$, as known in the art. As such, the combination of effectively converting input sample stream x[k] to a continuous-time signal (involving a gain equal to the sampling rate of $L/T_{in}$) with the gain of filter h(t) is unity.

Figure 1B:
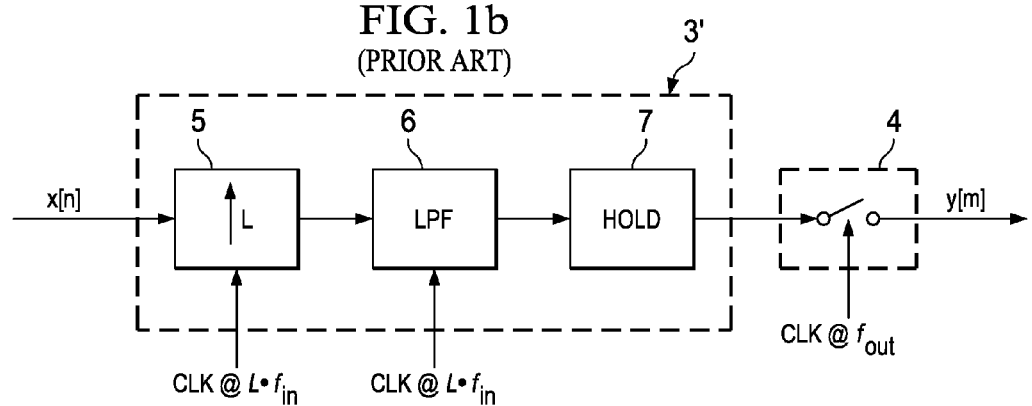
FIGS. 1b and 1c are electrical diagrams, in block form, of conventional asynchronous sample rate conversion functions.
Figure 1C:
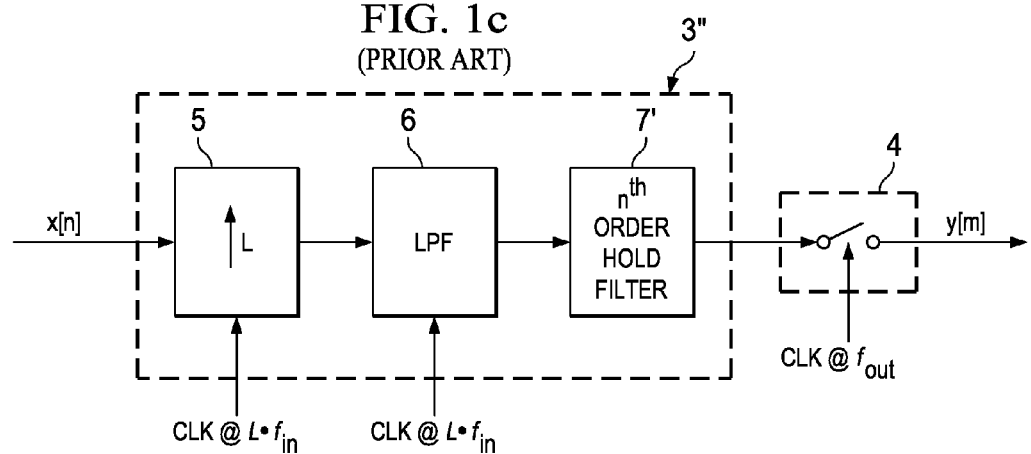

Various continuous-time impulse response shapes can be used, according to this embodiment of the invention, to attain these characteristics of impulse response |H(f)| by way of FIR digital filter function 52. A simple approach corresponds to the conceptual realization discussed above in connection with the conventional ASRC shown in FIG. 1b. In this example, the impulse response h(t) applied by zero-order hold function 7' is simply a unit rectangular pulse (duration=1 and amplitude=1), time-scaled to have a duration of $T_{in}/L$, and from which the output sample stream (at the desired output frequency $f_{out}$) is merely the most recent input sample value:

$$h(t) = \begin{cases} 1, & \text{for } 0 < t < \frac{T_{in}}{L} \\ 0, & \text{otherwise} \end{cases}$$

The output of a zero-order sample-and-hold network is thus the most recent input sample value, held for one input sample period (i.e., in sampling time after L upsamples). The frequency response (transfer function |H(f)|) of this time-scaled zero-order hold is the first-order sinc function:

$$|H(f)| = \left(\frac{1}{L \cdot f_{in}}\right) \frac{\sin\left(\pi \frac{f}{L \cdot f_{in}}\right)}{\pi \frac{f}{L \cdot f_{in}}}$$

As such, this transfer function |H(f)| has stop bands centered at multiples of the output frequency $L \cdot f_{in}$. As mentioned above, this time-scaling of transfer function |H(f)| applies a gain of $T_{in}/L$ that is normalized to unity gain, at DC, by virtue of the effective conversion of the input sample stream to a continuous-time signal. However, as noted above, in order to obtain reasonable accuracy and granularity in sample rate conversion using a zero-order hold, extremely high values of the upsampling factor L (e.g., on the order of one million) are required.

This high L requirement is overcome, according to embodiments of the invention. In one example, FIR digital filter 52 is realized by filter coefficients based on samples of an impulse response having the shape of an $n^{th}$-order sinc filter (n>1). Alternatively, other filter functions such as B-spline polynomial filters, such as Lagrange polynomials, and as described in commonly assigned copending U.S. application Ser. No. 12/210,794, filed Sep. 15, 2008, incorporated herein by this reference and to which this application claims priority, may be used. For example, the $n^{th}$-order sinc filter transfer function, or frequency response, has notches (stop bands) centered at the expected image frequencies. The particular order of this $n^{th}$ order sinc filter characteristic can be selected according to the desired precision of the sample rate conversion, and according to the selected upsampling ratio L. For example, it has been observed that a sinc filter of order n=5 is suitable for digital audio applications, in combination with an upsampling ratio L=4.

As known in the art, one can recursively define an $n^{th}$ order sinc function as n repeated integrals of the first order sinc function (i.e., as a cascade of n zero-order hold filters). Beginning with:

$$h_{i,j}(t) = h_i(t) \text{ for } j \leq t \leq j+1$$

where the first order (i=1) sinc function is:

$$h_{1,0}(t) = 1$$

$$h_{1,j}(t) = 0 \text{ for } j \neq 0$$

for a 1 Hz sample rate, the $n^{th}$ order sinc function is given by integrals of the $(n-1)^{th}$ order sinc function:

$$h_{i,j}(t) = \int_j^t h_{i-1,j}(u)du + \int_{t-1}^j h_{i-1,j-1}(u)du$$

Figure 4C:
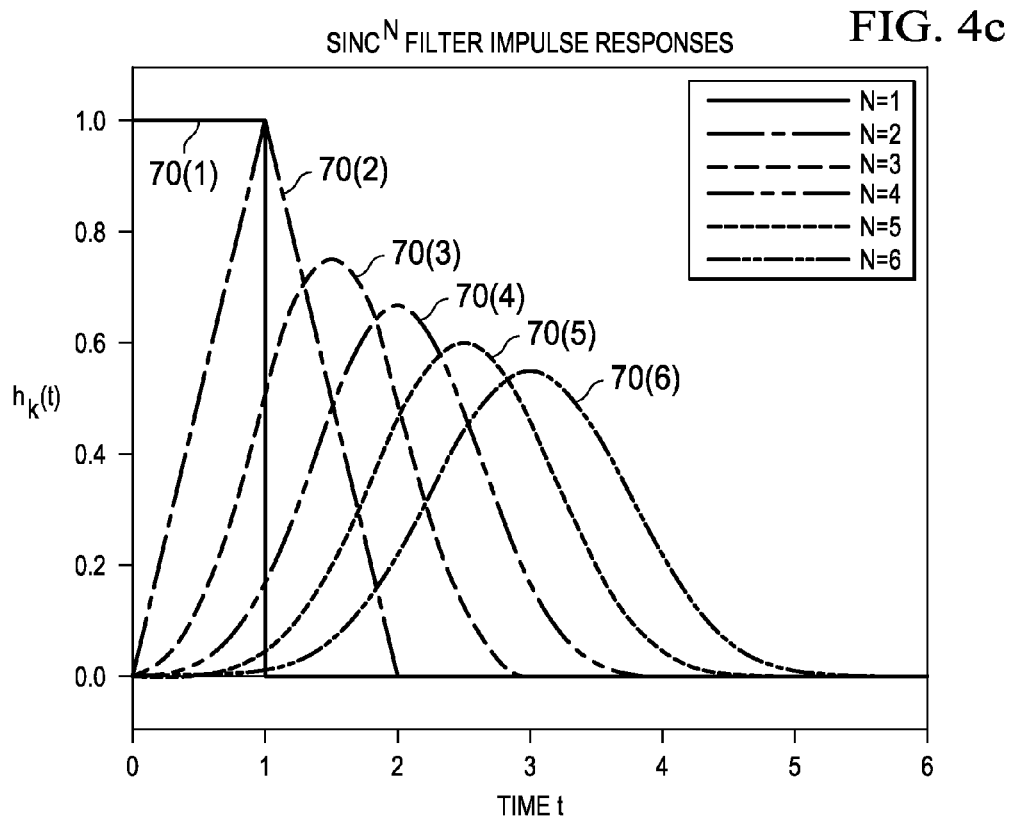
FIG. 4c illustrates the time-domain impulse response of filters according to sinc functions of varying order.

FIG. 4c illustrates examples of six time-domain impulse response characteristics, as plots 70(1) through 70(6), for first (n=1) through sixth (n=6) order sinc filters, respectively. The first-order sinc filter represented by plot 70(1) is a zero-order hold, and has a step-function impulse response shape, as discussed above, while plot 70(2) for the second-order sinc illustrates its two-point linear interpolation impulse response. Plots 70(3) through 70(5) of FIG. 4c show the corresponding higher-order sinc function impulse response characteristics. As discussed above, the frequency response of these sinc-based filter functions includes notches corresponding to those shown by way of example in FIG. 4b.

According to this embodiment of the invention, as discussed above, the impulse response h(t) for the filter function applied by FIR digital filter function 52, and from which sampled values at various time instants constitute the FIR coefficient values, is expressed by piece-wise polynomial functions. For example, referring to FIG. 4c, the representations of each of plots 70(3) through 70(6) can each be broken into portions corresponding to the time units, and a polynomial used to characterize the shape of the impulse response in that time interval. Corresponding polynomial coefficients will, of course, define the shape of the polynomial within each of the time intervals.

Figure 4D:
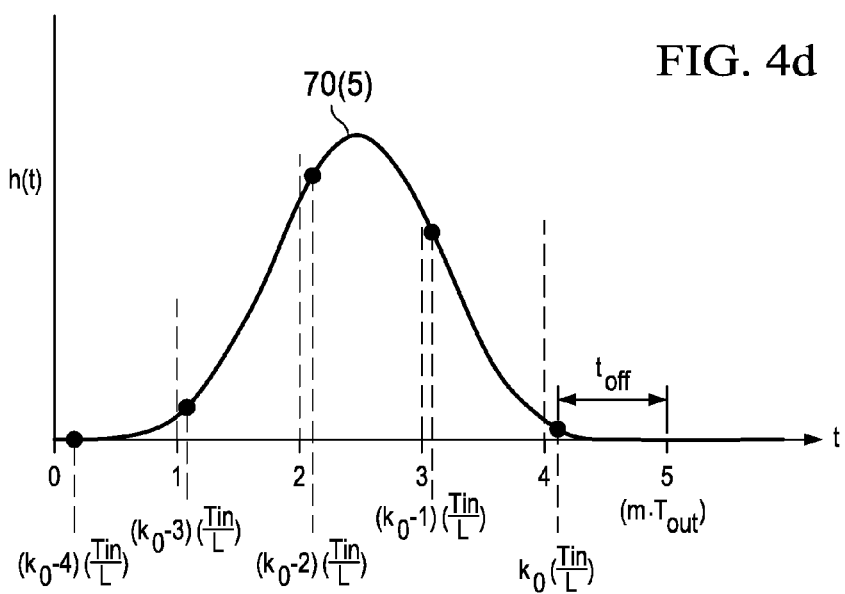
FIG. 4d is a timing diagram illustrating the evaluation of FIR filter coefficients in the resampling filter of FIG. 4a in the upsampling case, in an embodiment of the invention.

FIG. 4d illustrates plot 70(5) from FIG. 4c, which represents the impulse response $h_5(t)$ for the fifth-order sinc function. The duration of the impulse response $h_5(t)$ is finite, five time units in length, which results in a finite number (five) of non-zero FIR coefficients $b_{m,k}$. In this example, therefore, five polynomials of some preselected order (e.g., $4^{th}$ order polynomials) can be used to express the impulse response characteristic, with each polynomial corresponding to one of the five unit time intervals from time t=0 to time t=5 shown along the horizontal axis of FIGS. 4c and 4d. Each of these five polynomial expressions, which together express this impulse response $h_5(t)$, are evaluated to return a corresponding one of the FIR coefficients $b_{m,k}$. In this case, if one considers the output sample time $mT_{out}$ as occurring at time t=5 in FIG. 4d (strictly speaking, the convolution interval flips the time axis to place $mT_{out}$ at time t=0, but due to the symmetry in h(t), the result is the same whether this flipping occurs or not), and considering $k_0$ as the most recent input sample prior to output sample time $mT_{out}$, an offset time $t_{off}$ can be defined as the phase difference between the output sample time $mT_{out}$ and the most recent input sample time $$k_0\left(\frac{T_{in}}{L}\right):$$

$$t_{off} = m \cdot T_{out} - k_0 \frac{T_{in}}{L}$$

This offset time $t_{off}$ is also the offset time of the corresponding input sample time within each of the other intervals, relative to the end of the interval.

The FIR coefficient corresponding to the time interval between t=4 and t=5 in FIG. 4d is the value of impulse response $h_5(t)$ at time:

$$\tau_5 = m \cdot T_{out} - (k_0)\left(\frac{T_{in}}{L}\right)$$

where $k_0$ is the most recent input sample time prior to output sample time $mT_{out}$, which resides within that interval. The FIR coefficient corresponding to this tap is thus the value of $h_5(t)$ sampled at the offset time $t_{off}$ prior to the current output sample time $mT_{out}$. Each of the other FIR coefficients can be similarly determined by evaluating the polynomial for a corresponding time interval, at the same offset time within that interval as within the other intervals, or in other words at time instant $\tau_{m,j}$:

$$\tau_{m,j} = m \cdot T_{out} - (k_0 - j)\left(\frac{T_{in}}{L}\right)$$

for the $j^{th}$ interval. The entire set of $N_p$ FIR coefficients thus correspond to the values of impulse response $h_5(t)$, derived by evaluating a polynomial expression at the same time within each of the N time intervals. In the example of FIG. 4d, $N_p$=5, which corresponds to the duration of the impulse response $h_5(t)$ in this example. In this upsampling case, as described above, the time τ in each interval at which the corresponding FIR coefficient is evaluated is at the same offset time $t_{off}$ from the end of the interval. It has been observed, in connection with this invention, that the evaluation of these coefficients by FIR coefficient calculator 42 from polynomial expressions of the impulse response, and their application to FIR digital filter 52, is therefore especially efficient.

The implementation of FIR digital filter function 52, according to this embodiment of the invention, thus applies a finite impulse response digital filter having a number of taps that depend on the duration of the underlying impulse response $h_5(t)$ of the filter function. And, referring to FIG. 4a, the FIR coefficients (tap values) applied by FIR digital filter function 52 are calculated by FIR coefficient calculator 42 based on the output from frequency ratio estimator 38 communicated thereto via lines SRC_R, which communicates the phase relationship of the output sample time to the input sample times, as described above.

The computational complexity of this approach may be somewhat increased from that of conventional methods, because some computational effort is required to determine the phase offset $t_{off}$ between the output sample time and the input sample points, and to calculate the FIR coefficients by evaluating each of the polynomial expressions. Conventional methods, as discussed above, store a large number of FIR coefficients in memory. However, the memory resources required according to this embodiment of the invention are much reduced from those of conventional ASRC functions, and the computational load is moderated by the use of this filter only for the upsampling case and not also for downsampling, in combination with the band-limiting applied by upsampler 32 and low-pass filter 50, described above.

As mentioned above, various continuous-time impulse response shapes other than an $n^{th}$-order sinc filter can be used, according to this embodiment of the invention, to attain the desired stop band and pass band characteristics. For example, other polynomial spline filter functions, such as Lagrange polynomials, may be used to derive FIR digital filter function 52. Further in the alternative, an improved polynomial interpolation filter can be used to define the coefficients applied by FIR digital filter function 52. This improved polynomial interpolation filter is described in commonly assigned copending U.S. application Ser. No. 12/210,794, filed Sep. 15, 2008, incorporated herein by this reference and to which this application claims priority. The polynomial filter described in this copending U.S. application Ser. No. 12/210,794 is based on polynomial coefficients that are derived from linear simultaneous equations that are typically used to calculate the filter coefficients themselves, following which the polynomial coefficients are stored in memory and retrieved in real time to calculate the filter coefficients. In any case, the selected filter will have a finite time-domain impulse response, so that digital filter function 52 can be realized as an FIR filter, and preferably such an impulse response that can be expressed in piece-wise fashion by polynomials of reasonable order.

It is contemplated that the coefficients of any of these polynomial expressions can be stored in matrix form in memory, such as read-only memory, within coefficient calculation function 42. That is, these polynomial coefficients for the desired impulse response characteristic of FIR filter 52 can be calculated a priori, and made available to coefficient calculation function 42 during live operation of ASRC 15. The manner in which this filter characteristic is so derived and its polynomial coefficients stored a priori, according to this embodiment of the invention, will now be described relative to FIGS. 5a through 5d.

Figure 5B:
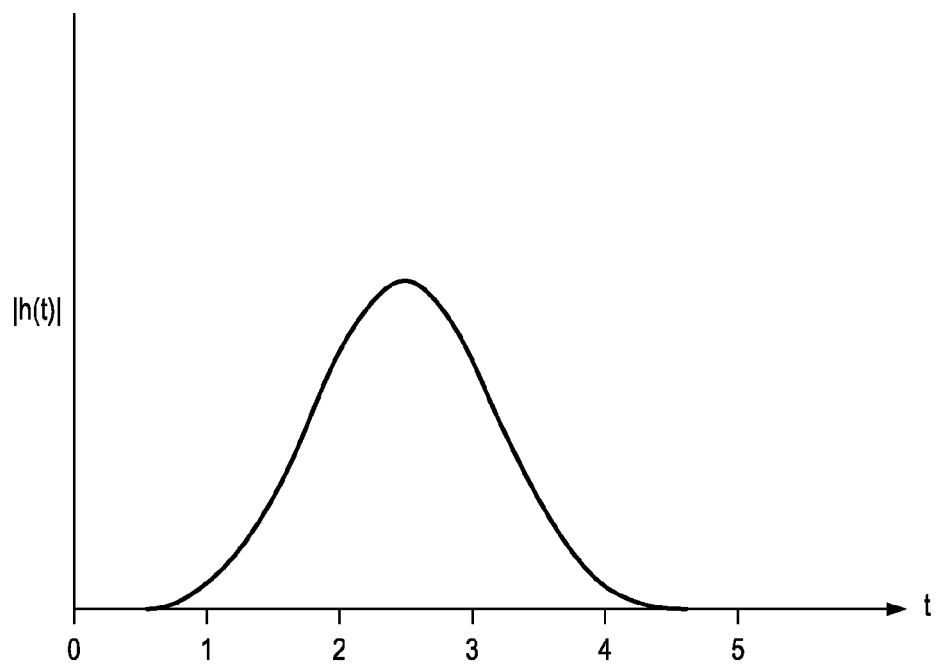
FIGS. 5b through 5d are impulse response plots illustrating an approach to deriving polynomial estimates of the polynomial expressions of the resampling filter impulse response, according to embodiments of the invention.

As shown in FIG. 5a, the desired impulse response to be realized by FIR digital filter function 52 is first selected in process 72. For the example of a $5^{th}$ order sinc function, selected in process 72, the impulse response of finite duration is shown in FIG. 5b. This particular impulse response can be expressed exactly by way of piece-wise polynomial segments of some order. For example, a fourth-order polynomial expression $h_5(t)$ can be used to express a $5^{th}$-order sinc function over each of five intervals of the impulse response:

$$h_5(t) = \begin{cases} \frac{1}{24}t^4 & 0 \leq t < 1 \\ -\frac{5}{24} - \frac{5}{6}t - \frac{5}{4}t^2 + \frac{5}{6}t^3 + \frac{1}{6}t^4 & 1 \leq t < 2 \\ \frac{155}{24} - \frac{25}{2}t + \frac{35}{4}t^2 - \frac{5}{2}t^3 + \frac{1}{4}t^4 & 2 \leq t < 3 \\ -\frac{655}{24} + \frac{65}{2}t - \frac{55}{4}t^2 + \frac{5}{2}t^3 - \frac{1}{6}t^4 & 3 \leq t < 4 \\ \frac{625}{24} - \frac{125}{6}t - \frac{25}{4}t^2 - \frac{5}{6}t^3 + \frac{1}{24}t^4 & 4 \leq t < 5 \end{cases}$$

In this case (decision 73 is "yes"), the coefficients of the polynomial expressions are stored in internal memory of the FIR coefficient calculation function 42, or elsewhere accessible to function 42, in process 78.

Figure 5C:
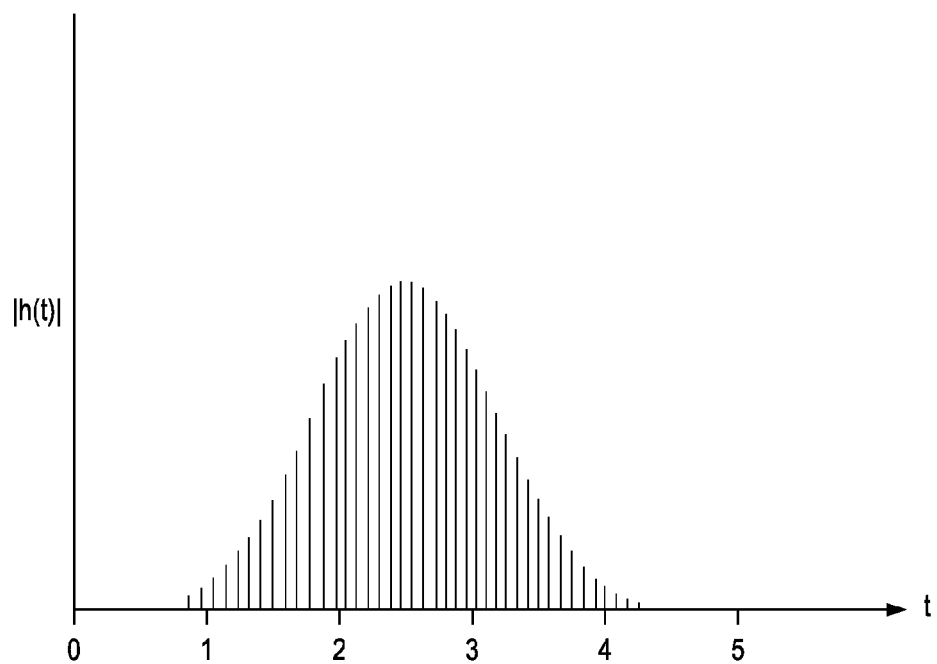
Figure 5D:
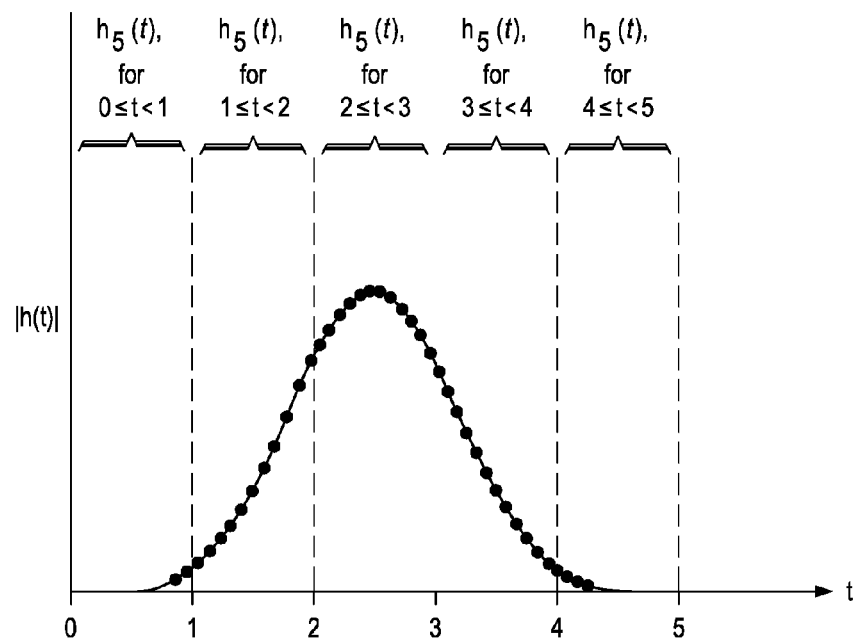

For other filter functions, an exact polynomial representation may not exist (decision 73 is "no"). According to this embodiment of the invention, approximations of those polynomial representations, over each interval in the impulse response, are used to define the filter. For such filter functions, in process 74, the continuous-time impulse response represented by the selected filter function is sampled, at some arbitrary but preferably relatively high sample rate relative to the impulse response duration. An example of such sampling for the impulse response of FIG. 5b is illustrated in FIG. 5c. Sampling process 74 provides a sequence of sample values that are numerically processed, in process 76, to provide a polynomial approximation of the continuous-time impulse response over each defined interval within the impulse response. In the example of FIG. 5c, the duration of the impulse response of the selected filter characteristic from t=0 to t=5 is divided into five intervals, each of unit length in this example. Polynomial approximations based on the sample values within each of these intervals are derived in process 76, using conventional numerical analysis methods. For example, the polynomial approximations can be generated by way of a conventional least-squares approximation that minimizes a least-square difference between the resulting coefficient values and target values. Another approach to derivation of these polynomial approximations is direct solution according to a minimum mean squared error (MMSE) approximation. In any event, a polynomial approximation based on the sampled impulse response values within each interval is derived, with the polynomial being of an order selected based on such factors as the available coefficient memory, the desired computational load for evaluation of the polynomial in live operation, and the desired level of fidelity.

Each of these polynomial expressions (whether exact or approximated) may be further subdivided within their corresponding time interval, and a piece-wise approximation using a lower order polynomial derived for each subinterval, in optional process 77. For example, the (exact) fourth-order polynomial for the interval $2 \leq t < 3$ of the $5^{th}$ order sinc function could be approximated, in process 77, by the piece-wise combination of a third-order polynomial over the interval $2.0 \leq t < 2.5$ and another third-order polynomial over the interval $2.5 \leq t < 3.0$. In operation, only the third-order polynomial for the subinterval containing the input sample time would be evaluated; the third-order polynomial for the other subinterval would not be evaluated, as no input sample value will lie within that subinterval. While this optional subdivision of intervals, in process 77, requires additional memory space to store the additional coefficients (in this example, memory space for storing eight, rather than five, coefficients per impulse response interval), the computational load of evaluating a third-order polynomial is substantially less than that for evaluating a fourth-order polynomial. This optional process 77 thus enables a tradeoff of memory space for computational efficiency. Regardless of whether subdivision process 77 is performed, the coefficients corresponding to the polynomials expressing the impulse response are available in memory, for example in the internal memory of FIR coefficient calculation function 42, following process 78.

In the operation of ASRC 15, as mentioned above, these polynomial coefficient values expressing or approximating the impulse response of FIR digital filter function 52 are used to evaluate the FIR coefficients to be applied by FIR digital filter function 52 to actual input sample values provided by upsampler 32 and low-pass filter 50. As known in the art, and as evident from FIGS. 4c and 5d, the values of the FIR coefficients $b_{m,k}$ in the conventional FIR filter evaluation of output sample y[m]:

$$y[m] = \sum_{k=-\infty}^{\infty} b_{m,k} x[n-k]$$

are functions of time t that are based on the polynomial expressions for the impulse response. Each FIR coefficient $b_{m,k}$ corresponds to one of the intervals of the impulse response; the impulse response of FIG. 5d thus will define five FIR coefficients ("taps"), one for each of its time intervals. In other words, the number $N_p$ of non-zero coefficients in the FIR summation is the number of non-zero coefficients $b_{m,(k0-Np-1)}$ to $b_{m,k0}$ that generate output sample y[m]. As such, filter 52 can be considered as a standard FIR digital filter with $N_p$ taps that have values that vary from sample to sample.

These tap values can be considered as a one-dimensional set of $N_p$ coefficients $a_0$ to $a_{N_p-1}$, which may be expressed in terms of the unit filter impulse response p(t) or the time-scaled version thereof that generates filter impulse response h(t):

$$a_n = h\left(t_{\mathit{off}} + n\frac{T_{in}}{L}\right) = p\left(t_{\mathit{off}} + n\frac{L}{T_{in}}\right)$$

Evaluation of the "resampled" output sample value y[m] by filter 52 is thus performed by evaluating the $N_p$ coefficients $a_0$ to $a_{N_p-1}$, and summing over k=0 to k=$N_p$−1.

The evaluation of each of the coefficients $a_n$ is carried out by evaluating the exact or estimated polynomial expression for the filter impulse response. For the example of the five piece-wise $4^{th}$ order polynomials given above, coefficient $a_3$ corresponding to the time interval 2≦t<3 will be determined by evaluating the polynomial expression:

$$a_3|_\tau = \frac{155}{24} - \frac{25}{2}t + \frac{35}{4}t^2 - \frac{5}{2}t^3 + \frac{1}{4}t^4$$

at time t=τ of the corresponding input sample within time interval 2≦t<3. As discussed above relative to FIG. 4a, FIR digital filter function 52 operates at the sample rate L·$f_{in}$, and as such one input sample value x[n−k] (for k=0 to $N_p$−1) from filter 50 is applied for each time interval of the impulse response; five FIR coefficients are therefore required to be calculated by FIR coefficient calculator function 42 in generating each output sample value y[m]. This time τ is, of course, based on the instantaneous phase offset $t_{\mathit{off}}$ between the input sample times and the output sample time (which corresponds to t=5 in FIGS. 4c and 5b through 5d).

According to the preferred embodiment of the invention, referring now to FIG. 5e, frequency ratio estimator 38 provides a time stamp ramp value corresponding to the instantaneous time of each input sample of the upsampled and filtered input sample stream, to FIR coefficient calculator function 42, in process 80. Based on that time stamp ramp value, FIR coefficient calculator 42 can identify the times τ of the input sample values within each applicable interval of the FIR filter impulse response (process 82). FIR coefficient calculator function 42 retrieves, from memory, the polynomial coefficients for each applicable interval (process 84), and evaluates the corresponding polynomials (process 86) to determine the FIR coefficient values $b_{m,k}$ (i.e., the set of $N_p$ coefficients $a_n$) to be applied by FIR digital filter function 52. In process 88, FIR digital filter function 52 performs its digital filter function to derive the current output sample value y[m], as the sum of the products of the FIR coefficient values calculated in process 86 with the N most recent input sample values received from low-pass filter 50:

$$y[m] = \sum_{k=0}^{N_p-1} a_k x[n-k]$$

In this example, for an impulse response as shown in FIGS. 4c and 5b through 5d, N=5 taps, and each of the five FIR coefficients calculated from the five polynomial expressions given above are applied to corresponding input sample values x(n) to x(n−k), where k=4.

Alternatively to the calculation of the FIR filter coefficients in process 86, as discussed above, these FIR filter coefficients can be generated a priori (similarly as described above for the coefficients of the polynomial approximations), and stored in memory, such as a read-only memory or other look-up table arrangement. However, as discussed above, these coefficients depend on the desired frequency characteristics, including the requirement that the cutoff frequency of FIR digital filter function 52 track the lower of the input sample rate $f_{in}$ and the output sample rate $f_{out}$. As such, considering that these filter coefficients can vary with the selected input source, and also considering that FIR digital filter function 52 is applying a relatively complex filter function (e.g., $5^{th}$ order sinc function), the memory required to store all of the possible filter coefficients would be quite large. It is therefore contemplated that performance and resources can be optimized, according to this embodiment of the invention, by calculating the FIR coefficients to be applied by FIR digital filter function 52 in "real-time", as described in FIG. 5e, and by evaluating a polynomial expression for each coefficient as a function of the relative phase between the output sample time and the input sample times, as detected by frequency ratio estimator 38. The computational cost of real-time calculation of these FIR filter coefficients, by FIR coefficient calculator function 42, is dramatically lessened considering that ASRC 15 will typically be implemented in a multi-channel audio system, in which case multiple synchronous audio channels are being simultaneously processed. In other words, asynchronous sample rate conversion by ASRC 15 and processing by digital audio processor 12 will be carried out for these multiple channels simultaneously. Because these channels will be synchronous with one another, however, the same FIR filter coefficients evaluated by FIR coefficient calculator 42 for one channel will apply to all channels. Each channel will, of course, apply its own FIR digital filter function 52, because the input sample values for each channel will differ from one another. It is contemplated that those skilled in the art having reference to this specification will be readily able to implement the appropriate program code and computational resources necessary to perform this evaluation of the FIR filter coefficients in this manner.

Because it is clocked at L·$f_{in}$, low-pass filter 50 properly tracks the input sample rate $f_{in}$, as is desired in this upsampling case in which the input sample rate $f_{in}$ is lower than the output sample rate $f_{out}$. It has been discovered, according to this embodiment of the invention, that the use of upsampler 32 and low-pass filter 50 in the upsampling situation greatly reduces the complexity of downstream processing in resampler 40. More specifically, as the upsampling factor L applied by upsampler 32 and low-pass filter 50 increases, the stop band width required of the conceptual continuous-time filter (exemplified by transfer function |H(f)| of FIG. 4b) narrows. In this embodiment of the invention, as a consequence of the coefficients of FIR digital filter function 52 being derived by effectively sampling the impulse response h(t) of a continuous-time filter, the frequency response of FIR digital filter function 52 varies from sample-to-sample, and in general is an all-pass filter with a delay equal to the offset time $t_{\mathit{off}}$ between the output sample time and the most recent input sample, which varies from output sample to output sample. This delay is a fraction of a sample period, and as such FIR digital filter function 52 may be considered to implement a "fractional delay" filter (with the delay accurate up to a bandwidth of $f_a$). Because the stop band width required of this frequency response, relative to the upsampled sampling rate, narrows with increasing L, the frequency band over which FIR digital filter 52 must be accurate is reduced, which in turn reduces the number of taps required in the FIR realization of digital filter 52 for a given level of performance.

The number of taps that are provided in FIR digital filter function 52 (i.e., the number of filter coefficients forwarded) is thus determined by the desired level of accuracy and the computational capacity of FIR coefficient calculator 42. For example, implementation of filter 52 as a five-tap FIR filter, with each tap expressed as a $4^{th}$ order polynomial, has been observed to provide suitable performance. This relatively modest length of FIR digital filter function 52 is in large part due to upsampler 32 and low-pass filter 50 band-limiting the input signal, which reduces the frequency band over which FIR digital filter 52 must be accurate, and thus the number of taps required. FIR digital filter function 52 then generates the value of the next output sample y[m], and forwards this sample value downstream (e.g., to digital audio processor 12 of FIG. 2) at the desired output sample rate of 48 kHz in this example. The process then repeats for the next output sample value y[m] in the output sequence.

Downsampling (R>1)

According to this embodiment of the invention, in the downsampling case (R>1), the processing of the input signal by resampler 40 differs from that described above for upsampling. In a conceptual sense, the input sample stream x[n] is converted to a continuous time signal x(t) in the form of a stream of delta impulses:

$$x(t) = \sum x[k]\delta(t - k \cdot T_{in})$$

As known in the art, the spectrum of continuous-time signal x(t) is the same as that of the input sample stream x[n], but with a gain of $1/T_{in}$ (i.e., the input sample rate). Sample rate conversion is accomplished by filtering the continuous-time signal x(t) with a continuous-time filter, having impulse response h(t), to produce a continuous-time signal g(t) that is then resampled to produce an intermediate signal u[k], sampled at a rate of L times the desired output sample rate $L/T_{out}$. Subsequent decimation by a factor L produces the final output signal y[m].

Figure 6A:
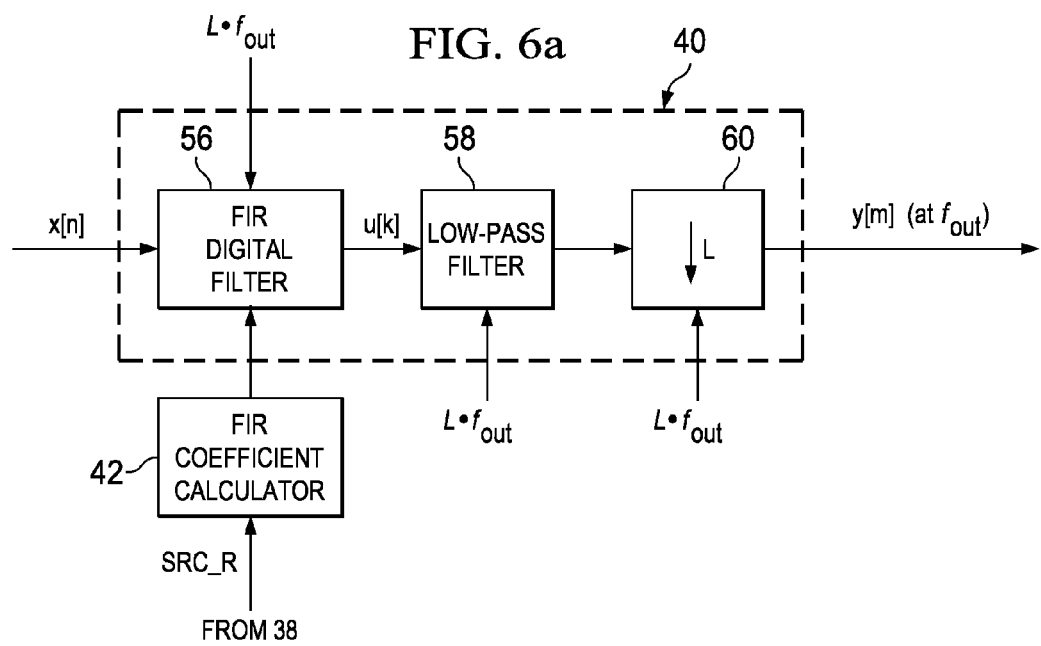
FIG. 6a is an electrical diagram, in block form, illustrating the functional arrangement of the FIR digital filter and resampler function of asynchronous sample rate converter of FIG. 2 in the downsampling case.

FIG. 6a illustrates the data flow for this downsampling case, according to embodiments of the invention. In this case, the incoming sample stream x[n] is at a sample rate $1/T_{in}$ that is above the output sample rate $1/T_{out}$. For the example of digital audio receiver 10, the input sample rate may range from above 48 kHz to as high as 200 kHz, and the desired output sample rate (at which digital audio processor 12 will process the digital audio data) is 48 kHz. As shown in FIG. 6a for this embodiment of the invention, incoming sample stream x[n] is received by digital filter function 56 in resampler 40. According to this embodiment of the invention, digital filter function 56 applies a digital filter function to generate an upsampled and interpolated sample stream u[k] at an upsampled output sample rate $L/T_{out}$ (or sample frequency $L \cdot f_{out}$). As in the upsampling case, FIR digital filter 56 applies FIR coefficients that are calculated by FIR coefficient calculator 42 by evaluating polynomial expressions for the impulse response h(t) over intervals of that response, as a function of the phase offset between the desired output sample time and the input sample times, as detected by frequency ratio estimator 38.

According to this embodiment of the invention, as in the upsampling case, the impulse response h(t) implemented by digital filter function 56 is a time-scaled version of a unit filter p(t):

$$h(t) = p\left(t \frac{L}{T_{out}}\right)$$

Figure 6B:
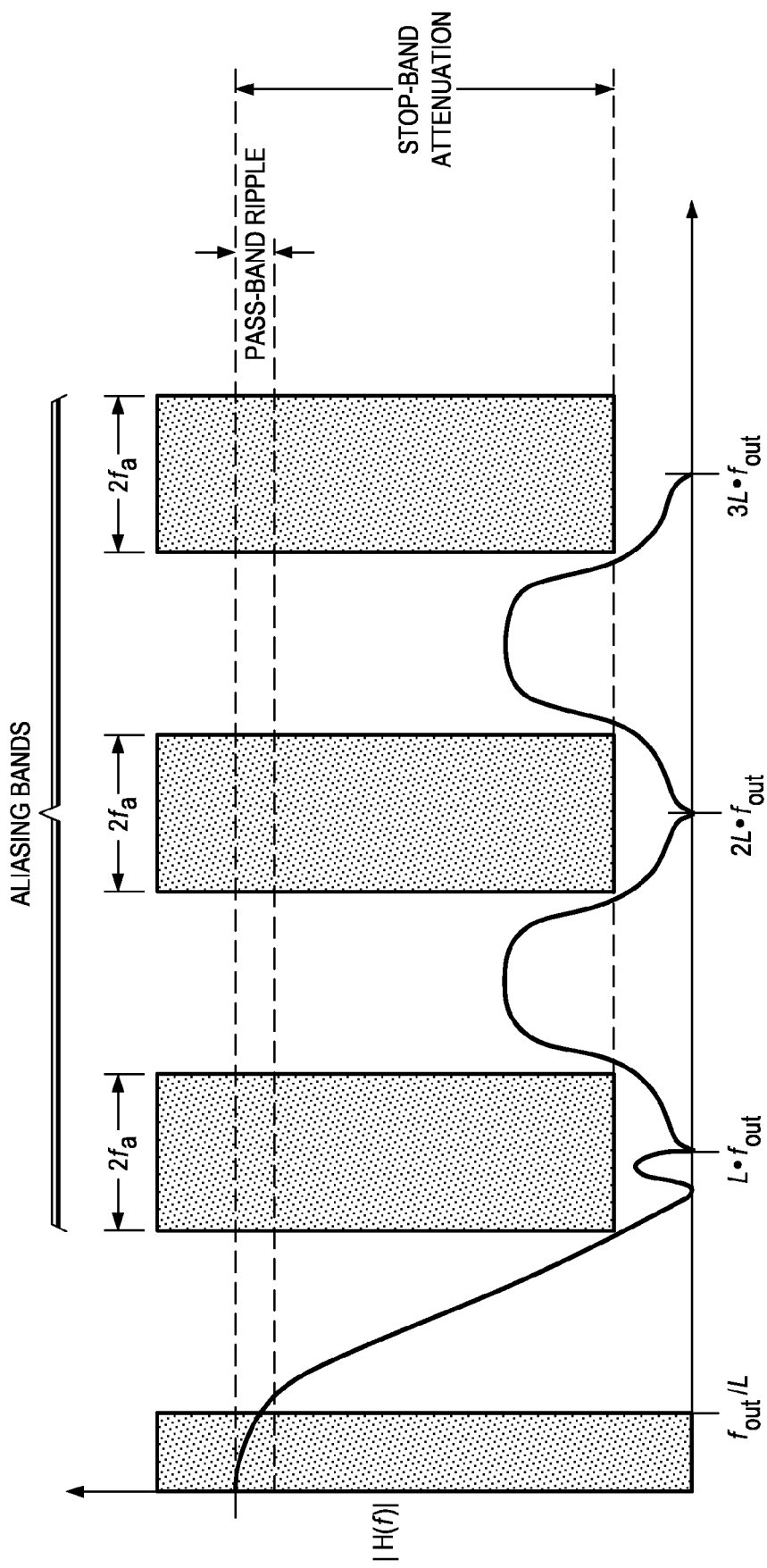
FIG. 6b is a transfer function plot of an idealized resampling filter in the upsampling case, according to an embodiment of the invention.

This time-scaling places notches (i.e., stop bands) that are centered at multiples of $L \cdot f_{out}$ in the frequency response |H(f)| of this filter, as shown in FIG. 6b. As discussed above, sample rate conversion in cases where the ratio R exceeds unity (i.e. in the downsampling case) requires a filter with a cutoff frequency that follow the output sample rate $f_{out}$. This requirement is met by this time-scaled unit filter approach. However, filter 56 does not band-limit the continuous-time signal g(t) that is resampled at the sample rate of $L \cdot f_{out}$, because information is present in signal g(t) at frequencies greater than the Nyquist frequency of the output sampling rate.

It has been discovered, however, that because the notches in frequency response |H(f)| of filter 56 align exactly with multiples of the output sampling rate (i.e., multiples of $L \cdot f_{out}$), proper design of the stop-band of filter 56 at those notches can enable downstream decimation filtering to eliminate that aliasing. As shown in FIG. 6b, frequency response |H(f)| of filter 56 has stop-bands of width $2f_a$ at each of its notches. So long as the stop-band limit $f_a$ is above the Nyquist rate of the ultimate output signal (i.e., above $f_{out}/2$), then proper low-pass filtering of the output of filter 56 (which includes aliasing from resampling), can eliminate these aliasing components.

As shown in FIG. 6a, resampler 40 according to this embodiment of the invention includes low-pass digital filter 58 and decimator 60 in the data flow following digital filter 56. This arrangement establishes a combined filter, of digital filter 56 in combination with filter 58 and decimator 60, that has a cutoff frequency at the Nyquist rate of the ultimate output sample rate $f_{out}$ (i.e., after decimation by L), and in which filter 58 provides adequate attenuation above that Nyquist rate to remove aliasing components. It has also been discovered that, because filter 58 and decimator 60 operate at a fixed sample rate $L \cdot f_{out}$, the coefficients of filter 58 can be fixed, and the computational requirements of these functions 58, 60 implemented in an efficient manner. Furthermore, as will now be described, the continuous-time filter h(t) can be derived in a similar fashion, from the same unit filter p(t), as used in the upsampling case described above. This further facilitates implementation of resampler 40, by permitting much of the same functionality to participate in both the upsampling and downsampling cases.

As in the upsampling case described above, the DC gain of these circuit functions within resampler 40 must be taken into account. As noted above, the effective conversion of the input sample stream x[n] to the continuous-time version x(t) applies a gain of $1/T_{in}$. The continuous-time filter h(t) realized by filter 56 applies a DC gain of $T_{out}/L$, resulting in an overall DC gain of R/L, where R is the conversion ratio ($T_{out}/T_{in}$, or $f_{in}/f_{out}$). Resampler 40 therefore preferably corrects for this non-unity gain factor; an example of such correction will be described below in connection with the more detailed description of resampler 40 according to this embodiment of the invention.

Referring back to FIG. 6a, one can again conceptually consider the function of digital filter function 56 as converting the input digital sample stream x[n] into a filtered continuous-time signal g(t), and then resampling that signal at an upsampled output sample rate $L \cdot f_{out}$ to produce an upsampled sample stream u[k]. The continuous-time filtering that produces the intermediate signal g(t) can be expressed as a convolution integral of a continuous-time signal x(t) representing the input sample stream x[n], with an impulse response h(t) of the filter function:

$$g(t) = (x*h)(t) = \int_{-\infty}^{\infty} x(\tau)h(t-\tau)d\tau$$

The intermediate output sample stream u[k] is then obtained by sampling signal g(t) at time instants $m \cdot T_{out}/L$ (m being a sample index):

$$u[k] = g\left(m \cdot \frac{T_{out}}{L}\right) = \sum_k x[k] \cdot h\left(m \cdot \frac{T_{out}}{L} - k \cdot T_{in}\right) = \sum_k x[k] \cdot b_{m,k}$$

where the coefficients $b_{m,k}$ are expressed as sampled values of impulse response h(t):

$$b_{m,k} = h\left(m \cdot \frac{T_{out}}{L} - k \cdot T_{in}\right)$$

As in the upsampling case, therefore, the evaluation of intermediate output sample stream u[k] is an FIR filter calculation, with its coefficients derived from sampling the impulse response h(t). This permits the conceptual operations of conversion of the input signal to continuous-time, continuous-time filtering, and resampling, to be realized, in combination, by FIR digital filter function 56 of FIG. 6*a*, which applies coefficient values that vary as a function of the output sample index m.

In practice, these coefficients will also vary with the phase offset $t_{off}$ between the output sample time $m \cdot T_{out}/L$ and the input sample times $k \cdot T_{in}$. As such in the upsampling case, one can rename these FIR coefficients $b_{m,k}$ into a one-dimensional set of $N_p$ tap values $a_0$ to $a_{N_p-1}$, expressed in terms of offset $t_{off}$, by:

$$a_n = h(t_{off} + n \cdot T_{in}) = p\left(t_{off} \frac{L}{T_{out}} + n \cdot L \cdot \frac{T_{in}}{T_{out}}\right)$$

considering that impulse response h(t) is a time-scaled version of the unit filter response p(t). The number $N_p$ of non-zero filter coefficients $a_n$ therefore scales proportionally, on the average, with the conversion ratio R:

$$N_p \approx N \frac{T_{out}}{L \cdot T_{in}} = N \frac{R}{L}$$

where N is the duration of the unit filter p(t).

Similarly as in the upsampling case, according to this embodiment of the invention, the downsampling impulse response h(t) is considered in the form of a piece-wise expression over a number of intervals. More specifically, the intervals of the impulse response h(t) are defined by a number of output sample periods, at the sample rate $L \cdot f_{out}$, over the duration of the impulse response h(t). However, the evaluation of the filter coefficients is somewhat more complicated in this downsampling case. While the impulse response h(t) is sampled at the input rate, the duration of impulse response h(t) is scaled by the output rate to ensure that the notches of the frequency response |H(f)| align with multiples of the sample rate $L \cdot f_{out}$. This causes the position of the input sample points within each interval of the impulse response h(t) to vary from interval to interval, in contrast to the upsampling case in which the offset $t_{off}$ specified the position of each input sample point within each interval of the impulse response h(t). According to this embodiment of the invention, coefficient calculation function 42 of FIG. 6*a* calculates the coefficients for FIR digital filter function 56 by executing a calculation loop, beginning with the offset of a first coefficient and then effectively iteratively adding the input sample period $T_{in}$ to evaluate each of the coefficients in the sequence. In practice, this iterative evaluation steps through the unit filter p(t) in time-steps of t=L/R, which facilitates the computation because the polynomial coefficients can be stored in memory relative to the unit filter shape p(t). This operation will be described in connection with FIG. 6*c*.

Figure 6C:
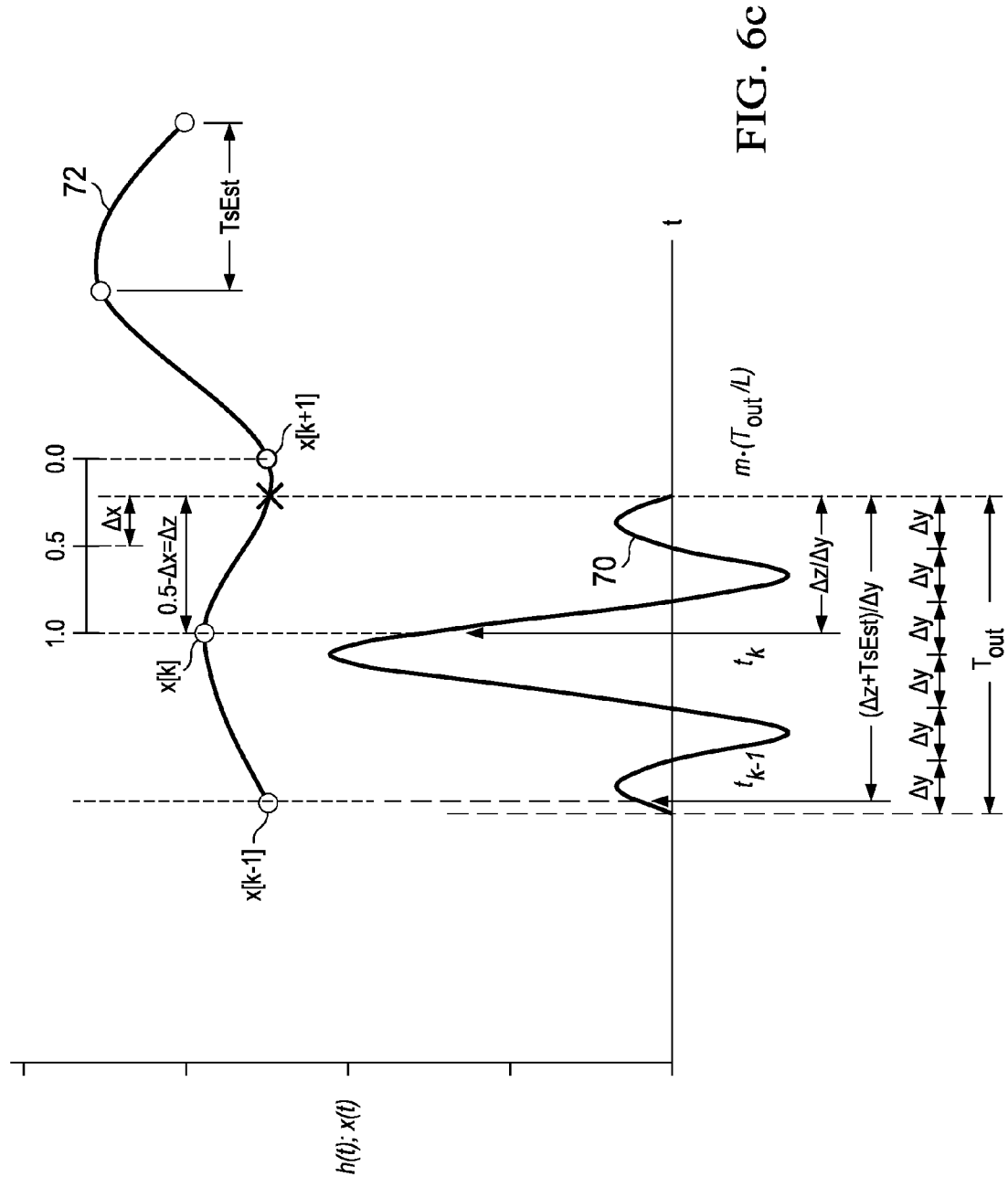
FIG. 6c is a timing diagram illustrating the evaluation of FIR filter coefficients in the resampling filter of FIG. 6a in the downsampling case, in an embodiment of the invention.

FIG. 6*c* illustrates impulse response h(t), and a reconstructed version of the input signal x[n]. Curve 70 shows impulse response h(t), which has a duration considered in six intervals in this case, each interval corresponding to a time Δy. According to this embodiment of the invention, each of these intervals of impulse response h(t) is expressed as a polynomial of some order. The manner in which the polynomial expressions for each interval is derived corresponds to that described above in connection with the upsampling case, and as such depends on the filter function being used. The filter functions useful in connection with the downsampling case are the same as discussed above, examples of which include $n^{th}$-order sinc functions, other polynomial spline filter functions such as Lagrange polynomials, and the improved polynomial interpolation filter described in commonly assigned copending U.S. application Ser. No. 12/210,794, filed Sep. 15, 2008, incorporated herein by reference. In the case of an $n^{th}$-order sinc function, exact polynomial expressions can be derived for impulse response h(t) over each of the intervals. For other filter functions, polynomial approximations can be derived for each interval, for example following the approach described above relative to FIGS. 5*a* through 5*d*. Also as discussed above, the polynomial expression for a particular interval of impulse response h(t) may be itself further subdivided into two or more polynomial expressions of lower order, to obtain further computational efficiency at a cost of increased memory load (to store the polynomial coefficients for the sub-intervals).

The duration of impulse response h(t) corresponds to a time-scaling of unit filter p(t), as mentioned above. More specifically, this duration of h(t) is $N \cdot L/T_{out}$, where N is the integer duration of unit filter p(t). For example, if the unit filter p(t) has a duration N=6 and decimation factor L=4, the duration of h(t) will equal 1.5 times the output sample period $T_{out}$. In the example of FIG. 6*c*, curve 72 illustrates, for purposes of this description, a continuous-time reconstruction of input sample sequence x[n], as obtained by filtering a continuous-time representation x(t) of that input sequence with a near-ideal low-pass continuous-time filter. In reality, as described above, continuous-time signal g(t) is the signal that is actually resampled according to this embodiment of the invention; that signal g(t) is not a full reconstruction of the input signal, but is a filtered version of that signal to suppress components in stopbands centered at multiples of $L \cdot f_{out}$. For purposes of this description, two input samples x[k] and x[k−1] (which, as mentioned above, will be samples of filtered signal g(t) at input sample times) are present within the duration of impulse response h(t). The points in time corresponding to these input samples are, of course, the times at which the polynomial expressions for impulse response h(t) are to be evaluated by coefficient calculation function 42 in its calculating of the tap values for FIR digital filter function 56.

To calculate the first tap value corresponding to the time of input sample $x[k_0]$ at the most recent input sample time prior to the desired output sample time, according to this embodiment of the invention, coefficient calculation function 42 identifies the interval in which that input sample x[k] falls, and identifies the position of that input sample within that interval. According to this embodiment of the invention, the time $t_k$ is calculated in a particularly efficient manner. The time within that interval corresponding to $t_k$ is first determined from the input sample period $T_{in}$, based on the duration between successive input samples. In this embodiment of the invention, as described above, frequency ratio estimator 38 is a low-pass filter with a very low cutoff frequency that operates on the sequence of time stamps; as a result, frequency ratio estimator 38 is capable of generating a smoothed average estimate of the input sample period. The midpoint time of the input sample period within which the desired output sample time $m \cdot T_{out}/L$ falls is first determined. For example, this midpoint time can be determined as the midpoint of the estimated input sample period $T_{sEst}$ beginning with the most recently received input sample, or the time $t_k$ plus $T_{sEst}/2$. Once this midpoint time is identified (shown as "0.5" in FIG. 6c), a time period $\Delta z$ is calculated as the midpoint time minus a signed value $\Delta x$ corresponding to the time interval from output sample time $m \cdot T_{out}/L$ and the midpoint time. In the example of FIG. 6c, this interval $\Delta x$ is a negative value, because the midpoint time is earlier than the output sample time $m \cdot T_{out}/L$. The time period $\Delta z$ is then divided by the time interval $\Delta y$ into which the impulse response h(t) is divided (i.e., the time interval corresponding to a polynomial approximation). The integer portion of this quotient $\Delta z/\Delta y$ is the interval within which the input sample time $t_k$ for input sample x[k] falls, and the fractional portion of this quotient is the offset time within that interval (measuring backward from the end of the interval) of time $t_k$. In the example of FIG. 6c, time $t_k$ falls within the fourth of the six intervals of impulse response h(t). The polynomial expression for this fourth interval can now be evaluated at that time $t_k$ to derive a first FIR filter coefficient, or tap value.

To obtain the time $t_{k-1}$ of the next preceding input sample x[k−1], the value of the estimated input sample period $T_{sEst}$ is added to the calculated time period $\Delta z$, and that sum is divided by the time interval $\Delta y$ into which the impulse response h(t) is divided. Again, the integer portion of this quotient indicates which interval within impulse response h(t) that time $t_{k-1}$ falls, and the fractional portion indicates the position of time $t_{k-1}$ within that interval.

This process continues for each input sample time that falls within the duration of impulse response h(t). In this asynchronous downsampling case in which the duration of the impulse response h(t) is scaled by the output sample rate $L \cdot f_{out}$, the number of input samples within duration of impulse response h(t) can, and most likely will, vary over time. The number of input samples for a given output sample period will depend on the downsampling ratio R and on the phase alignment of the input and output sample streams relative to one another in that output sample period.

The operation of ASRC 15 in this downsampling case, as in the upsampling case, generally follows the process described above relative to FIG. 5e. Frequency ratio estimator 38 provides a time stamp ramp value corresponding to the instantaneous time of each input sample of the upsampled and filtered input sample stream, to FIR coefficient calculator function 42, in process 80. FIR coefficient calculator 42 evaluates the polynomial expressions for the filter coefficients of the particular filter to be applied by FIR filter function 56, in process 82 through 86. As described above, the evaluation of these coefficients includes process 82, in which the times t of the input samples are determined, and process 84 in which the applicable polynomial expressions are retrieved, for example by retrieving the applicable polynomial coefficients from memory. In this downsampling case, of course, the identification of the input sample times t and also the retrieval of the appropriate polynomial expressions are carried out by way of a process corresponding to that shown by way of example in FIG. 6c, considering that the impulse response h(t) is of a duration scaled by the output sample rate. In process 86, the applicable polynomial expressions to the input sample times are evaluated, generating the FIR tap values $a_n$ to be used by FIR digital filter function 56.

In this embodiment of the invention, FIR filter function 56 then performs process 88 to produce intermediate output sample stream u[k] at the sample rate $L \cdot f_{out}$. As in the upsampling case, once the coefficient tap values $a_n$ are calculated, this evaluation of process 88 is performed upon the $N_p$ most recent input sample values:

$$y'[m] = \sum_{k=0}^{N_p-1} a_k x[n-k]$$

As mentioned above, the number of taps $N_p$ depends on the sample rate conversion ratio R and also the decimation ratio L within resampler 40:

$$N_p \approx N \frac{T_{out}}{L \cdot T_{in}} = N \frac{R}{L}$$

where N is the duration of the unit filter p(t).

As shown in FIG. 6a, low-pass filter 58 and decimator 60 are provided within resampler 40, downstream from FIR digital filter function 56. As discussed above, while FIR digital filter function 56 provides a filter with a cutoff frequency that tracks the output sample rate $f_{out}$, this filter does not band-limit the resulting signal. The notches in the frequency response of the filter implemented by FIR digital filter function 56 as described above, however, align with multiples of the output sample rate, and provides a stop-band of sufficient bandwidth $f_a$ (above the Nyquist rate of the ultimate output signal y[m]) that downstream low-pass filter 58 can eliminate aliasing components. According to this embodiment of the invention, low-pass filter 58 thus receives the intermediate output sequence u[k], and removes the aliasing components.

In addition, as noted above, the DC gain of FIR digital filter function 56 is not unity. Rather, the overall DC gain of FIR digital filter function 56 is R/L, where R is the conversion ratio ($T_{out}/T_{in}$, or $f_{in}/f_{out}$). Accordingly, it is useful for low-pass filter 58 (or, alternatively, some other digital signal processing function in the data flow) to apply a compensating gain of L/R to the signal that is output by FIR digital filter function 56.

Decimator 60 then produces the eventual output sample stream y[m] at the desired output sample rate $f_{out}$. According to this embodiment of the invention, the decimation factor L is kept modest, for example L=2 or =4, thus reducing the effective sampling rate at which FIR digital filter function 56 must operate. Similarly as in the upsampling case, the band-limiting provided by low-pass filter 58 and decimator 60 allows the number of taps required of fractional delay FIR digital filter 56 to be modest. This reduces the computational effort required of FIR coefficient calculator 42, and also reduces the computations involved in FIR digital filter 56 itself during operation.

According to this embodiment of the invention, in connection with the downsampling case, the complexity of FIR filter 56 varies with the input sample rate $f_{in}$, and thus with the selection of the input signal source, even though the position of the stop bands remains constant (i.e., tracking multiples of output sample rate $f_{out}$). In the downsampling situation, the ratio R of input to output sample rates ($f_{in}/f_{out}$) exceeds unit (R>1), which means that more than one input sample is received for each output sample value generated, and that therefore, on the average, more than one input sample affects each output sample value. On the other hand, the absolute transition band of FIR digital filter 56 preferably remains constant, even as the input sample rate $f_{in}$ (and ratio R) increases. Accordingly, the number of taps $N_p$ required in FIR digital filter function 56 varies proportionally with ratio R, as discussed above. According to this embodiment of the invention, this number $N_p$ is determined by polynomial coefficient calculator 42, based on the sensing performed by frequency ratio estimator 38.

General Operation

Referring back to FIG. 2, the output of ASRC 15 as generated in the manner described above, in either the upsampling or the downsampling situation, is then applied to multiplexer 16, which forwards the sample rate converted digital audio input signal to digital audio processor 12, at a sample rate $f_{out}$ that is independent of the selected digital audio input, and thus independent of the input sample rate (which may vary widely, for example from 8 kHz to as high as about 200 kHz). Digital audio processor 12 then carries out the desired audio signal processing, at this constant sample rate $f_{out}$ and at sample rates derived therefrom, resulting in a PCM output signal that is applied to PWM audio processor 20, which in turn derives pulse-width modulated output signals for driving the loudspeakers SPKR_n via amplifier stages $22_n$.

Substantial computational and operational efficiencies are attained by way of the arrangement of ASRC 15 according to the preferred embodiment of the invention, in which different ASRC algorithms are applied in the upsampling and downsampling contexts. FIG. 7 illustrates a measure of the number of multiply-and-accumulate operations (i.e., machine cycles) K required to process a single output sample, as a function of the ratio R=$f_{in}/f_{out}$, as obtained from simulation. In FIG. 7, plot 62 illustrates the upsampling algorithm described above in connection with FIG. 4a. While not shown in FIG. 7, plot 62 would, if continued for sample rate ratio R>1, discontinuously double at R=$1^+$ because of loss of the properties of half-band filter 50 at this increased input sample rate. While techniques may be applied to reduce the impact of the upsampling algorithm as applied to downsampling situations, such computational load greatly increases as R increases beyond unity, especially considering the $R^2$ scaling of a high tap-count upsampling filter operating at a rate that increases proportionally with ratio R.

As described above in detail, a different ASRC algorithm is applied for the downsampling case. Plot 64 illustrates the number of cycles required for carrying out the filtering operations involved in the ASRC function according to the preferred embodiment of the invention in the downsampling case, as described above relative to FIG. 6a. According to the preferred embodiment of the invention, the number of cycles K required in this downsampling situation follows the ratio R. As evident from this relationship, at the point of ratio R=1, the number of cycles K required according to the downsampling algorithm exactly equals the number of cycles K required according to the upsampling algorithm. As evident from FIG. 7, the computational load of the ASRC process in the downsampling case scale linearly, but at a relatively flat slope, as the ratio R increases beyond unity. In practice, an increase in the computational burden will be evident in going from the upsampling case to the downsampling case (i.e., at R=1), considering that the calculation of the FIR coefficients is somewhat more complex. However, as described above, it is contemplated that this increase in computational complexity is not sufficiently burdensome to outweigh the efficiency gained in the resampling filter operations according to embodiments of this invention.

According to this approach, the filters simulated in FIG. 7 have been observed to have a 100 dB stop band, for the example of a $sinc^5$ polynomial filter. This excellent performance is attained with a high degree of computational efficiency, while keeping the memory requirements modest. As mentioned above, the filter coefficients need not be stored in advance for approximating the continuous-time filter over the entire signal period; rather, only those filter coefficients at or near the output sample point in time are calculated "on-the-fly" from the polynomial representation, reducing the size of the memory necessary.

Furthermore, according to this preferred embodiment of the invention, jitter in the sample rate conversion is substantially eliminated. This jitter reduction results from the smoothing effect of the frequency ratio estimator, realized as a low-pass filter with a very low cutoff frequency. Use of this frequency ratio estimator technique, in combination with calculation of the filter coefficients at the detected phase position of the output sample relative to the input samples, effectively filters out much of the jitter in the ASRC process.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method for asynchronous sample rate conversion, the method comprising:
    receiving an input signal, in the form of a sample stream at an input sample rate;
    determining a relationship between the input sample rate and an output sample rate;
    responsive to the determining step determining that the input sample rate is lower than the output sample rate, converting the sample rate of the input signal to the output sample rate according to a first sample rate conversion algorithm;
    responsive to the determining step determining that the input sample rate is higher than the output sample rate, converting the sample rate of the input signal to the output sample rate according to a first sample rate conversion algorithm;
    determining a phase offset of a current output sample at the output sample rate relative to the samples of the input signal; and
    calculating digital filter coefficients for use in the converting steps by evaluating polynomial expressions for the digital filter coefficients responsive to the phase offset of the current output sample.

2. The method of claim 1, wherein the step of determining a phase offset comprises:
  responsive to each input sample, identifying a time stamp value; and
  filtering a sequence of the time stamp values with a low-pass filter having a very low cutoff frequency to generate an estimate of the input sample period.

3. The method of claim 1, wherein the step of converting the sample rate of the input signal to the output sample rate according to the first sample rate conversion algorithm comprises:
  upsampling the input signal by an upsampling factor, at a sample rate corresponding to the input sample rate multiplied by the upsampling factor;
  applying a low-pass digital filter to the upsampled input signal, at a sample rate corresponding to the input sample rate multiplied by the upsampling factor; and
  applying a finite impulse response (FIR) filter, using the calculated digital filter coefficients, to the filtered signal from the digital filter.

4. The method of claim 3, wherein the calculating step comprises:
  receiving the phase offset; and
  for each of a plurality of intervals of an impulse response of a filter function corresponding to an input sample time, evaluating a polynomial expression for the impulse response in that interval at the input sample time to produce a calculated digital filter coefficient.

5. The method of claim 4, wherein the evaluating step comprises:
  identifying an interval offset from the end of the corresponding interval, for a most recent input sample time relative to the output sample time; and
  for each of the plurality of intervals:
    retrieving polynomial coefficients of the polynomial expression from memory for the interval; and
    applying the interval offset to a polynomial using the retrieved polynomial coefficients for the interval.

6. The method of claim 4, wherein the number of intervals in the impulse response equals the duration of a unit filter that is time-scaled according to the upsampling factor and the input sample period to derive the filter function, wherein the polynomial expressions for the impulse response in each interval are of a first selected order, and wherein the method further comprises subdividing at least one of the plurality of intervals into at least two sub-intervals, each sub-interval expressed by a polynomial expression of a second order higher than the first selected order, and wherein the evaluating step comprises
  identifying the sub-interval within a corresponding interval within which an input sample time falls; and
  evaluating the polynomial expression for the identified sub-interval.

7. The method of claim 4, wherein the filter function is an $n^{th}$-order sinc function.

8. The method of claim 4, wherein the polynomial expressions for the impulse response are approximations to the impulse response in that interval.

9. The method of claim 8, wherein the method further comprises:
  identifying sample points within the impulse response of the filter function; and
  deriving a polynomial expression for each of the intervals based on the identified sample points.

10. The method of claim 4, wherein the receiving step receives a plurality of input sample streams that are synchronous with one another, each input sample stream corresponding to an audio channel, and wherein the upsampling and applying steps are performed simultaneously for each of the plurality of sample streams, and wherein the FIR filter applies the same calculated digital filter coefficient for each of the audio channels.

11. The method of claim 1, wherein the step of converting the sample rate of the input signal to the output sample rate according to the second sample rate conversion algorithm comprises:
  applying a FIR filter, using the calculated digital filter coefficients, to the input signal;
  applying a low-pass digital filter to the signal output from the fractional delay FIR filter, at a sample rate corresponding to the output sample rate multiplied by a decimation factor; and
  decimating the signal filtered by the low-pass digital filter, by the decimation factor, to produce a signal at the output sample rate.

12. The method of claim 11, wherein the calculating step further comprises:
  receiving the phase offset; and
  for each of a plurality of intervals of an impulse response of a filter function corresponding to an input sample time, evaluating a polynomial expression for the impulse response in that interval at the input sample time to produce a calculated digital filter coefficient.

13. The method of claim 12, wherein the evaluating step comprises, for each of the plurality of intervals:
  identifying an interval offset from the end of the corresponding interval to an input sample time corresponding to that interval;
  retrieving polynomial coefficients of the polynomial expression from memory for the interval; and
  applying the interval offset to a polynomial using the retrieved polynomial coefficients for the interval.

14. The method of claim 12, wherein the number of intervals in the impulse response equals the duration of a unit filter that is time-scaled according to the upsampling factor and the input sample period to derive the filter function, and wherein the polynomial expressions for the impulse response in each interval are of a first selected order, and wherein the method further comprises subdividing at least one of the plurality of intervals into at least two sub-intervals, each sub-interval expressed by a polynomial expression of a second order higher than the first selected order, and wherein the evaluating step comprises:
  identifying the sub-interval within a corresponding interval within which an input sample time falls; and
  evaluating the polynomial expression for the identified sub-interval.

15. The method of claim 12, wherein the filter function is an $n^{th}$-order sinc function.

16. The method of claim 12, wherein the polynomial expressions for the impulse response are approximations to the impulse response in that interval.

17. The method of claim 16, wherein the method further comprises:
  identifying sample points within the impulse response of the filter function; and
  deriving a polynomial expression for each of the intervals based on the identified sample points.

18. The method of claim 12, wherein the receiving step receives a plurality of input sample streams that are synchronous with one another, each input sample stream corresponding to an audio channel, and wherein the FIR filter applies the same calculated digital filter coefficient for each of the audio channels, and wherein the applying and decimating steps are performed simultaneously for each of the plurality of sample streams.

19. A method for asynchronous sample rate conversion, the method comprising:
receiving an input signal, in the form of a sample stream at an input sample rate;
determining a relationship between the input sample rate and an output sample rate;
responsive to the determining step determining that the input sample rate is lower than the output sample rate, converting the sample rate of the input signal to the output sample rate according to a first sample rate conversion algorithm;
responsive to the determining step determining that the input sample rate is higher than the output sample rate, converting the sample rate of the input signal to the output sample rate according to a first sample rate conversion algorithm; and
responsive to the input sample rate and output sample rate being related by a ratio of small integers, converting the sample rate of the input signal to the output sample rate by applying an interpolation filter using interpolation filter coefficients for a filter having a cutoff frequency corresponding to the folding frequency of the lower of the input and output sample rates.

20. Asynchronous sample rate conversion circuitry comprising:
an input that receives an input signal in the form of a sample stream at an input sample rate;
frequency ratio estimator circuitry that determines a relationship between the input sample rate and an output sample rate, wherein the frequency ratio estimator circuitry includes:
counter circuitry that outputs time stamp counts of cycles of a clock signal responsive to receiving input samples; and
low-pass digital filter circuitry that filters the time stamp counts according to a low-pass digital filter with very low cutoff frequency;
digital filter coefficient calculation circuitry that is coupled to the frequency ratio estimator circuitry; and
resampler circuitry that is coupled to receive the input signal from the input and that is coupled to receive digital filter coefficients from the digital filter coefficient calculation circuitry, for converting the sample rate of the input signal to the output sample rate according to a first sample rate conversion algorithm responsive to the frequency ratio estimator circuitry determining that the input sample rate is lower than the output sample rate, and according to a second sample rate conversion algorithm responsive to the frequency ratio estimator circuitry determining that the input sample rate is higher than the output sample rate.

21. Asynchronous sample rate conversion circuitry comprising:
an input that receives an input signal in the form of a sample stream at an input sample rate;
frequency ratio estimator circuitry that determines a relationship between the input sample rate and an output sample rate;
digital filter coefficient calculation circuitry that is coupled to the frequency ratio estimator circuitry; and
resampler circuitry that is coupled to receive the input signal from the input and that is coupled to receive digital filter coefficients from the digital filter coefficient calculation circuitry, for converting the sample rate of the input signal to the output sample rate according to a first sample rate conversion algorithm responsive to the frequency ratio estimator circuitry determining that the input sample rate is lower than the output sample rate, and according to a second sample rate conversion algorithm responsive to the frequency ratio estimator circuitry determining that the input sample rate is higher than the output sample rate, wherein, according to the first sample rate conversion algorithm, the resampler circuitry processes the input signal by a sequence of operations includes:
upsampling the input signal by an upsampling factor, at a sample rate corresponding to the input sample rate multiplied by the upsampling factor;
applying a low-pass digital filter to the upsampled input signal, at a sample rate corresponding to the input sample rate multiplied by the upsampling factor; and
applying a FIR filter to the input signal, to generate a sequence of output samples at the output sample rate, wherein the digital filter coefficient calculation circuitry calculates the digital filter coefficients by evaluating, for each of a plurality of intervals of an impulse response of a filter function, polynomial expressions for the impulse response in that interval at the input sample time.

22. The circuitry of claim 21, wherein the digital filter coefficient calculation circuitry evaluates the polynomial expressions by a sequence of operations comprising:
identifying an interval offset from the end of the corresponding interval, for a most recent input sample time relative to the output sample time; and
for each of the plurality of intervals:
retrieving polynomial coefficients of the polynomial expression from memory for the interval;
applying the interval offset to a polynomial using the retrieved polynomial coefficients for the interval.

23. The circuitry of claim 20, wherein the filter function is an $n^{th}$-order sinc function.

24. The circuitry of claim 20, wherein the polynomial expressions for the impulse response are approximations to the impulse response in that interval.

25. Asynchronous sample rate conversion circuitry comprising:
an input that receives an input signal in the form of a sample stream at an input sample rate;
frequency ratio estimator circuitry that determines a relationship between the input sample rate and an output sample rate;
digital filter coefficient calculation circuitry that is coupled to the frequency ratio estimator circuitry; and
resampler circuitry that is coupled to receive the input signal from the input and that is coupled to receive digital filter coefficients from the digital filter coefficient calculation circuitry, for converting the sample rate of the input signal to the output sample rate according to a first sample rate conversion algorithm responsive to the frequency ratio estimator circuitry determining that the input sample rate is lower than the output sample rate, and according to a second sample rate conversion algorithm responsive to the frequency ratio estimator circuitry determining that the input sample rate is higher than the output sample rate, wherein, according to the second sample rate conversion algorithm, the resampler circuitry processes the input signal by a sequence of operations includes:

applying a FIR filter to the input signal, to generate a sequence of filtered samples at the output sample rate multiplied by a decimation factor;

applying a low-pass digital filter to the filtered sample sequence, at a sample rate corresponding to the output sample rate multiplied by the decimation factor; and decimating the signal filtered by the low-pass digital filter, by the decimation factor, to produce a signal at the output sample rate, wherein the digital filter coefficient calculation circuitry calculates the digital filter coefficients by evaluating, for each of a plurality of intervals of an impulse response of a filter function, polynomial expressions for the impulse response in that interval at the input sample time.

26. The circuitry of claim 25, wherein the digital filter coefficient calculation circuitry evaluates the polynomial expressions by a sequence of operations comprising:

identifying an interval offset from the end of the corresponding interval to an input sample time corresponding to that interval;

retrieving polynomial coefficients of the polynomial expression from memory for the interval; and applying the interval offset to a polynomial using the retrieved polynomial coefficients for the interval, wherein the number of digital filter coefficients is proportional to the ratio of the input sample rate to the output sample rate.

27. The circuitry of claim 25, wherein the filter function is an $n^{th}$-order sinc function.

28. The circuitry of claim 25, wherein the polynomial expressions for the impulse response are approximations to the impulse response in that interval.

29. The circuitry of claim 20, wherein the asynchronous sample rate conversion circuitry further comprises:

control circuitry that is coupled to the frequency ratio estimator circuitry so as to issue a control signal to the digital filter and resampler circuitry indicating whether the input sample rate is higher or lower than the output sample rate.

30. Asynchronous sample rate conversion circuitry comprising:

an input that receives an input signal in the form of a sample stream at an input sample rate;

frequency ratio estimator circuitry that determines a relationship between the input sample rate and an output sample rate;

digital filter coefficient calculation circuitry that is coupled to the frequency ratio estimator circuitry; and resampler circuitry that is coupled to receive the input signal from the input and that is coupled to receive digital filter coefficients from the digital filter coefficient calculation circuitry, for converting the sample rate of the input signal to the output sample rate according to a first sample rate conversion algorithm responsive to the frequency ratio estimator circuitry determining that the input sample rate is lower than the output sample rate, and according to a second sample rate conversion algorithm responsive to the frequency ratio estimator circuitry determining that the input sample rate is higher than the output sample rate; and control circuitry that is coupled to the frequency ratio estimator circuitry and having an input receiving a signal indicating that the input sample rate and output sample rate are related by a ratio of small integers; and a multiplexer having a first input coupled to an output of the frequency ratio estimator circuitry, having a second input coupled to the control circuitry for receiving a sample rate ratio value, having a select input coupled to the control circuitry, and having an output coupled to the digital filter coefficient calculation circuitry, wherein, responsive to the control circuitry receiving the signal indicating that the input sample rate and output sample rate are related by a ratio of small integers, the control circuitry forwards a sample rate ratio value signal corresponding to the ratio of small integers to the second input of the multiplexer, and forwards a select input to the multiplexer to select its second input.

31. A digital audio receiver system comprising:

a plurality of inputs, for receiving a plurality digital input audio signals from a plurality of audio sources, the plurality of digital input audio signals in the form of sample streams at sample rates that vary from one another;

circuitry for selecting one of the plurality of inputs responsive to a user input;

digital audio processing circuitry for processing digital audio signals at a fixed sample rate, and for producing output drive signals for driving loudspeakers; and sample rate conversion circuitry including:

an input that receives an input signal in the form of a sample stream at an input sample rate;

frequency ratio estimator circuitry that determines a relationship between the input sample rate and an output sample rate, wherein the frequency ratio estimator circuitry includes:

counter circuitry that outputs time stamp counts of cycles of a clock signal responsive to receiving input samples; and low-pass digital filter circuitry that filters the time stamp counts according to a low-pass digital filter with very low cutoff frequency;

digital filter coefficient calculation circuitry that is coupled to the frequency ratio estimator circuitry; and resampler circuitry that is coupled to receive the input signal from the input and that is coupled to receive digital filter coefficients from the digital filter coefficient calculation circuitry, for converting the sample rate of the input signal to the output sample rate according to a first sample rate conversion algorithm responsive to the frequency ratio estimator circuitry determining that the input sample rate is lower than the output sample rate, and according to a second sample rate conversion algorithm responsive to the frequency ratio estimator circuitry determining that the input sample rate is higher than the output sample rate.

32. A digital audio receiver system comprising:

a plurality of inputs, for receiving a plurality digital input audio signals from a plurality of audio sources, the plurality of digital input audio signals in the form of sample streams at sample rates that vary from one another;

circuitry for selecting one of the plurality of inputs responsive to a user input;

digital audio processing circuitry for processing digital audio signals at a fixed sample rate, and for producing output drive signals for driving loudspeakers; and sample rate conversion circuitry including:

an input that receives an input signal in the form of a sample stream at an input sample rate;

frequency ratio estimator circuitry that determines a relationship between the input sample rate and an output sample rate;

digital filter coefficient calculation circuitry that is coupled to the frequency ratio estimator circuitry; and resampler circuitry that is coupled to receive the input signal from the input and that is coupled to receive digital filter coefficients from the digital filter coefficient calculation circuitry, for converting the sample rate of the input signal to the output sample rate according to a first sample rate conversion algorithm responsive to the frequency ratio estimator circuitry determining that the input sample rate is lower than the output sample rate, and according to a second sample rate conversion algorithm responsive to the frequency ratio estimator circuitry determining that the input sample rate is higher than the output sample rate, wherein, according to the first sample rate conversion algorithm, the resampler circuitry processes the input signal by a sequence of operations including:

upsampling the input signal by an upsampling factor, at a sample rate corresponding to the input sample rate multiplied by the upsampling factor;

applying a low-pass digital filter to the upsampled input signal, at a sample rate corresponding to the input sample rate multiplied by the upsampling factor; and applying a FIR filter to the input signal, to generate a sequence of output samples at the output sample rate, wherein the digital filter coefficient calculation circuitry calculates the digital filter coefficients by evaluating, for each of a plurality of intervals of an impulse response of a filter function, polynomial expressions for the impulse response in that interval at the input sample time.

33. The system of claim 32, wherein the digital filter coefficient calculation circuitry evaluates the polynomial expressions by a sequence of operations comprising:

identifying an interval offset from the end of the corresponding interval, for a most recent input sample time relative to the output sample time; and for each of the plurality of intervals:
retrieving polynomial coefficients of the polynomial expression from memory for the interval;
applying the interval offset to a polynomial using the retrieved polynomial coefficients for the interval.

34. The system of claim 32, wherein the filter function is an nth-order sinc function.

35. The system of claim 32, wherein the polynomial expressions for the impulse response are approximations to the impulse response in that interval.

36. The system of claim 32, wherein, according to the second sample rate conversion algorithm, the resampler circuitry processes the input signal by a sequence of operations comprising:

applying a FIR filter to the input signal, to generate a sequence of filtered samples at the output sample rate multiplied by a decimation factor;

applying a low-pass digital filter to the filtered sample sequence, at a sample rate corresponding to the output sample rate multiplied by the decimation factor; and decimating the signal filtered by the low-pass digital filter, by the decimation factor, to produce a signal at the output sample rate, wherein the digital filter coefficient calculation circuitry calculates the digital filter coefficients by evaluating, for each of a plurality of intervals of an impulse response of a filter function, polynomial expressions for the impulse response in that interval at the input sample time.

37. The system of claim 36, wherein the digital filter coefficient calculation circuitry evaluates the polynomial expressions by a sequence of operations comprising:

identifying an interval offset from the end of the corresponding interval to an input sample time corresponding to that interval;

retrieving polynomial coefficients of the polynomial expression from memory for the interval;

applying the interval offset to a polynomial using the retrieved polynomial coefficients for the interval, wherein the number of digital filter coefficients is proportional to the ratio of the input sample rate to the output sample rate.

38. The system of claim 36, wherein the filter function is an nth-order sinc function.

39. The system of claim 36, wherein the polynomial expressions for the impulse response are approximations to the impulse response in that interval.

40. A digital audio receiver system comprising:
a plurality of inputs, for receiving a plurality digital input audio signals from a plurality of audio sources, the plurality of digital input audio signals in the form of sample streams at sample rates that vary from one another;
circuitry for selecting one of the plurality of inputs responsive to a user input;
digital audio processing circuitry for processing digital audio signals at a fixed sample rate, and for producing output drive signals for driving loudspeakers; and
sample rate conversion circuitry including:
an input that receives an input signal in the form of a sample stream at an input sample rate;
frequency ratio estimator circuitry that determines a relationship between the input sample rate and an output sample rate;
digital filter coefficient calculation circuitry that is coupled to the frequency ratio estimator circuitry; and
resampler circuitry that is coupled to receive the input signal from the input and that is coupled to receive digital filter coefficients from the digital filter coefficient calculation circuitry, for converting the sample rate of the input signal to the output sample rate according to a first sample rate conversion algorithm responsive to the frequency ratio estimator circuitry determining that the input sample rate is lower than the output sample rate, and according to a second sample rate conversion algorithm responsive to the frequency ratio estimator circuitry determining that the input sample rate is higher than the output sample rate;
control circuitry that is coupled to the frequency ratio estimator circuitry and having an input receiving a signal indicating that the input sample rate and output sample rate are related by a ratio of small integers; and
a multiplexer having a first input coupled to an output of the frequency ratio estimator circuitry, having a second input coupled to the control circuitry for receiving a sample rate ratio value, having a select input coupled to the control circuitry, and having an output coupled to the digital filter coefficient calculation circuitry, wherein, responsive to the control circuitry receiving the signal indicating that the input sample rate and output sample rate are related by a ratio of small integers, the control circuitry forwards a sample rate ratio value signal corresponding to the ratio of small integers to the second input of the multiplexer, and forwards a select input to the multiplexer to select its second input.

41. A digital audio receiver system comprising:
a plurality of inputs, for receiving a plurality digital input audio signals from a plurality of audio sources, the plurality of digital input audio signals in the form of sample streams at sample rates that vary from one another;

circuitry for selecting one of the plurality of inputs responsive to a user input;

digital audio processing circuitry for processing digital audio signals at a fixed sample rate, and for producing output drive signals for driving loudspeakers; and sample rate conversion circuitry including:

an input that receives an input signal in the form of a sample stream at an input sample rate;

frequency ratio estimator circuitry that determines a relationship between the input sample rate and an output sample rate;

digital filter coefficient calculation circuitry that is coupled to the frequency ratio estimator circuitry; and resampler circuitry that is coupled to receive the input signal from the input and that is coupled to receive digital filter coefficients from the digital filter coefficient calculation circuitry, for converting the sample rate of the input signal to the output sample rate according to a first sample rate conversion algorithm responsive to the frequency ratio estimator circuitry determining that the input sample rate is lower than the output sample rate, and according to a second sample rate conversion algorithm responsive to the frequency ratio estimator circuitry determining that the input sample rate is higher than the output sample rate, wherein the selected input receives a plurality of input sample streams that are synchronous with one another, each input sample stream corresponding to an audio channel, and wherein the digital audio processing circuitry comprises circuitry for simultaneously processing multiple channels of digital audio signals simultaneously, for producing output drive signals for driving a plurality of loudspeakers, and wherein, according to the first sample rate conversion algorithm, the resampler circuitry performs the upsampling and applying operations simultaneously for each of the plurality of sample streams, and wherein, according to the second sample rate conversion algorithm, the resampler circuitry applies the FIR filter using the same calculated digital filter coefficient for each of the audio channels, and performs the applying and decimating operations simultaneously for each of the plurality of sample streams.

* * * * *